(12) United States Patent
DiJaili et al.

(10) Patent No.: US 6,822,787 B1
(45) Date of Patent: *Nov. 23, 2004

(54) LASING SEMICONDUCTOR OPTICAL AMPLIFIER WITH OPTICAL SIGNAL POWER MONITOR

(75) Inventors: Sol P. DiJaili, Moraga, CA (US); Jeffrey D. Walker, El Cerrito, CA (US)

(73) Assignee: Finisar Corporation, Sunnyvale, CA (US)

( * ) Notice: Subject to any disclaimer, the term of this patent is extended or adjusted under 35 U.S.C. 154(b) by 123 days.

This patent is subject to a terminal disclaimer.

(21) Appl. No.: 10/061,585

(22) Filed: Feb. 1, 2002

Related U.S. Application Data

(63) Continuation-in-part of application No. 09/299,824, filed on Apr. 26, 1999, now Pat. No. 6,347,104.
(60) Provisional application No. 60/274,410, filed on Mar. 9, 2001.

(51) Int. Cl.[7] .............................................. H01S 3/00

(52) U.S. Cl. ...................................................... 359/344

(58) Field of Search ...................... 359/344; 372/38.01, 372/20, 29.02

(56) References Cited

U.S. PATENT DOCUMENTS

| | | | |
|---|---|---|---|
| 3,467,906 A | 9/1969 | Cornely et al. ............... 330/4.3 |
| 3,828,231 A | 8/1974 | Yamamoto ................... 357/30 |
| 4,794,346 A | 12/1988 | Miller ........................ 330/4.3 |
| 5,299,054 A | 3/1994 | Geiger ....................... 359/251 |
| 5,305,412 A | 4/1994 | Paoli .......................... 385/122 |
| 5,436,759 A | * | 7/1995 | Dijaili et al. ............... 359/333 |
| 5,604,628 A | 2/1997 | Parker et al. ............... 359/344 |
| 5,754,571 A | 5/1998 | Endoh et al. ................. 372/20 |
| 5,771,320 A | 6/1998 | Stone .......................... 385/16 |
| 5,778,132 A | 7/1998 | Csipkes et al. ............. 385/135 |
| 5,805,322 A | 9/1998 | Tomofuji .................... 359/177 |
| 5,999,293 A | 12/1999 | Manning .................... 359/139 |
| 6,061,156 A | 5/2000 | Takeshita et al. ........... 359/117 |

(List continued on next page.)

FOREIGN PATENT DOCUMENTS

JP 56006492 1/1981 ............. H01S/3/18

OTHER PUBLICATIONS

Alcatel, "Alcatel Optronics introduces a Gain–Clamped Semiconductor Optical Amplifier," *Press Release for Immediate Publication,* OFC '98, San Jose (Feb. 1998), 1 unnumbered page.

Diez, S. et al., "Gain–Transparent SOA–Switch for High–Bitrate OTDM Add/Drop Multiplexing," *IEEE Photonics Technology Letters,* vol. 11, No. 1 (Jan. 1999), pp. 60–62.

Diez, S. et al., "Novel Gain–Transparent SOA–Switch for High Bitrate OTDM Add/Drop Multiplexing," ECOC '98, Madrid, Spain (Sep. 1998), pp. 461–462.

(List continued on next page.)

*Primary Examiner*—Mark Hellner
(74) *Attorney, Agent, or Firm*—Workman Nydegger

(57) ABSTRACT

An optical signal power monitoring and control system is described. The system comprises at least one lasing SOA that receives, amplifies, and outputs the optical signal. In response to the signal amplification, a ballast laser signal is output through a substrate of the lasing SOA. This ballast laser signal is indicative of the optical signal power. At least one detector converts the ballast laser signal to an electrical signal and transmits this electrical signal to a power monitor circuit. Using the electrical signal, the power monitor signal may determine the power of the electrical signal and the gain across the lasing SOA. A gain control circuit may adjust the gain across a tunable-gain lasing SOA or multi-stage optical amplifier in order to optimize the optical signal's strength. The electrical signal power and lasing SOA gain may be transmitted to a terminal to display this information or a warning may be generated when certain criteria are met.

65 Claims, 16 Drawing Sheets

U.S. PATENT DOCUMENTS

| | | | |
|---|---|---|---|
| 6,115,517 A | 9/2000 | Shiragaki et al. | 385/24 |
| 6,128,115 A | 10/2000 | Shiragaki | 359/128 |
| 6,317,531 B1 | 11/2001 | Chen et al. | 385/17 |
| 6,333,799 B1 | 12/2001 | Bala et al. | 359/128 |
| 6,335,992 B1 | 1/2002 | Bala et al. | 385/17 |
| 6,347,104 B1 * | 2/2002 | Dijaili et al. | 372/38.01 |
| 6,597,497 B2 * | 7/2003 | Wang et al. | 359/344 |

OTHER PUBLICATIONS

Diez, S. et al., "All–Optical Switch for TDM and WDM/TDM Systems Demonstrated in a 640Gbit/s Demultiplexing Experiment," *Electronics Letters*, vol. 34, No. 8 (Apr. 16, 1998), pp. 803–805.

Dorgeuille, F. et al., "1.28 Tbit/s Throughout 8/Spl Times/8 Optical Switch Based on Arrays of Gain–Clamped Semiconductor Optical Amplifier Gates," OFCC 2000, Baltimore, MD, Mar. 2000, vol. 4, pp. 221–223.

Dorgeuille, F. et al., "Fast Optical Amplifier Gate Array for WDM Routing and Switching Applications," OFC'98 Technical Digest, pp. 42–44.

Doussiere, P. et al., "Clamped Gain Travelling Wave Semiconductor Optical Amplifier for Wavelength Division Multiplexing Applications," Maui, Hawaii, Sep. 19–23, 1994, New York, IEEE, US, Vol. Conf. 14 (Sep. 14, 1994), pp. 185–186.

Evankow, JosephD. et al., "Photonic Switching Modules Designed With Laser Diode Amplifiers," *IEEE Journal on Selected Areas in Communications*, vol. 6, No. 7 (Aug. 1988), pp. 1087–1095.

Fernier, B. et al., "Fast (300 ps) Polarization Insensitive Semiconductor Optical Amplifier Switch With Low Driving Current (70 mA)," Semiconductor Laser Conference, Sep. 1992, pp. 130–131.

Fouquet, J.E. et al., "Compact, Scalable Fiber Optic Cross–Connect Switches," *Digest of the LEOS Summer Topical Meetings*, San Diego, CA, Jul. 1999, pp. 59–60.

Ibrahim, Magdy M., "Photonic Switch Using Surface–Emitting Laser Diode And APD," NRSC '99, Cairo, Egypt, Feb. 1999, pp. D7 1–D7 8.

Jeong, Gibong et al., "Gain Optimization in Switches Based on Semiconductor Optical Amplifiers," *Journal of Lightwave Technology*, vol. 13, No. 4 (Apr. 1995), pp. 598–605.

Kitamura, Shotaro, et al., "Spot–Size Converter Integrated Semiconductor Optical Amplifiers for Optical Gate Applications," *IBEE Journal of Quantum Electronics*, vol. 35, No. 7 (Jul. 1999), pp. 1067–1074.

Leuthold, Juerg et al., "All–Optical Space Switches with Gain and Principally Ideal Extinction Ratios," *IBEE Journal of Quantum Electronics*, vol. 34, No. 4 (Apr. 1998), pp. 622–633.

McAdams, Larry R. et al., "Linearizing High Performance Semiconductor Optical Amplifiers: Techniques and Performance," LEOS Presentation (1996), Thursday 11:00 AM, pp. 363–364.

Mork, J., et al., "Semiconductor Devices for All–Optical Signal Processing: Just How Fast Can They Go?," LEOS '99, San Francisco, CA, Nov. 1999, vol. 2, pp. 900–901.

Mutalik, Venkatesh G. et al., "Analog Performance of 1310–nm Gain–Clamped Semiconductor Optical Amplifiers," *OFC '97 Technical Digest*, Thursday 11:15 AM, pp. 266–267.

Panajotov, K. et al., "Polarisation Switching In Proton–Implanted VCSELs," *Digest of the LEOS Summer Topical Meetings*, San Diego, CA (Jul. 1999), Thursday 2:45 PM, pp. III55–III56.

Qiu, B.C. et al., "Monolithically Integrated Fabrication of 2×2 and 4×4 Crosspoint Switches Using Quantum Well Intermixing," Indium Phosphide and Related Materials, Conference Proceedings, Williamsburg, VA (May 2000), pp. 415–418.

Scheuer, J. et al., "Nonlinear On–Switching of High Spatial Frequency Patterns in Ring Vertical Cavity Surface Emitting Lasers," LEOS '99, San Francisco, CA (Nov. 1999), vol. 1, pp. 123–124.

Soto, H. et al., "All–Optical Switch Demonstration Using a Birefringence Effect In A Semiconductor Optical Amplifier," *CLEO Pacific Rim '99*, pp. 888–889.

Soulage, G. et al., "Clamped Gain Travelling Wave Semiconductor Optical Amplifier as a Large Dynamic Range Optical Gate," Alcatel Alsthom Recherche, route de Nozay, 91460 Marcoussis, France, undated, 4 unnumbered pages.

Tai, Chien et al., "Dynamic Range and Switching Speed Limitations of an N×N Optical Packet Switch Based on Low–Gain Semiconductor Optical Amplifiers," *Journal of Lightwave Technology*, vol. 14, No. 4 (Apr. 1996), pp. 525–533.

Tiemeijer, L.F. et al., "High–Gain 1310 nm Semiconductor Optical Amplifier Modules with a Built–in Amplified Signal Monitor for Optical Gain Control," *IEEE Photonics Technology Letters*, vol. 9, No. 3 (Mar. 1997), pp. 309–311.

Tiemeijer, L.F. et al., "Reduced Intermodulation Distrotion in 1300 nm Gain–Clamped MQW Laser Amplifiers," *IEE Photonics Technology Letters*, vol. 7, No. 3 (Mar. 1995), pp. 284–286.

Toptchiyski, Gueorgui et al., "Time–Domain Modeling of Semiconductor Optical Amplifiers for OTDM Applications," *Journal of Lightwave Technology*, vol. 17, No. 12 (Dec. 1999), pp. 2577–2583.

van Roijen, R. et al., "Over 15 dB Gain From A Monolithically Integrated Optical Switch With An Amplifier," *IEEE Photonics Technology Letters*, vol. 5, No. 5 (May 1993), pp. 529–531.

Walker, J.D. et al., "A Gain–Clamped, Crosstalk Free, Vertical Cavity Lasing Semiconductor Optical Amplifier for WDM Applications," summaries of the papers presented at the topical meeting, *Integrated Photonics Search; 1996 Technical Digest Series; Proceedings of Integrated Photonics;* Boston, MA, USA, 29.04–02.05 1996, vol. 6, 1996, pp. 474–477.

Yoshimoto, N. et al., "Spot–Size Converted Polarization–Insensitive SOA Gate With A Vertical Tapered Submicrometer Strip Structure," *IEEE Photonics Technology Letters*, vol. 10, No. 4 (Apr. 1998), pp. 510–512.

* cited by examiner

Tunable-Gain VLSOA 700

LASING SEMICONDUCTOR OPTICAL AMPLIFIER WITH OPTICAL SIGNAL POWER MONITOR

CROSS-REFERENCE TO RELATED APPLICATIONS

This application is a continuation-in-part of U.S. patent application Ser. No. 09/299,824, entitled "Optical Signal Power Monitor and Regulator," by Sol. P Dijaili and Jeffrey D. Walker, filed Apr. 26, 1999; now U.S. Pat. No. 6,347,104 and claims priority from provisional U.S. patent application Ser. No. 60/274,410, entitled "Optical Amplifier with Power/Gain Monitoring," by Sol P. DiJaili and Jeffrey D. Walker, filed Mar. 9, 2001. The subject matter of the foregoing application is incorporated herein by reference.

BACKGROUND OF THE INVENTION

1. Field of Invention

The present invention relates generally to power monitoring of lasing semiconductor optical amplifiers (SOA). Particularly, the present invention relates to monitoring emitted lasers through a cavity surface of the lasing SOA in order to determine a gain corresponding to the lasing SOA. More particularly, the present invention relates to monitoring optical signal power and adjusting gain across the lasing SOA in order to optimize the optical signal power.

2. Description of Related Art

Service providers are experiencing an ever-increasing demand for bandwidth fueled by Internet access, voice, data, and video transmissions and this demand will continue to grow. Due to this demand, network capacities are being stretched to their limit. As a result, there has been an increasing effort to lay fiber to build out the backbone of existing networks.

These efforts to increase the size of network infrastructures are still unable to meet the growing demand of bandwidth-hungry clients. In response, service providers are continually trying to maximize the utilization of their existing network. However, in order to efficiently utilize a network, a service provider must be able to monitor the capacity of each path within the network. Generally, in order to accomplish the requisite monitoring of networks, a service provider must employ a comprehensive array of network management components and applications. However, the cost of these network management systems is often very high. Also, often times the reliability of the network management systems is questionable due to its complexity.

A key factor in the efficient utilization of a network is the ability to detect the failure of a specific path within the network. In addition to determining whether a network path has failed, it is also important that the source of the failure can be detected and subsequently repaired. Thus, there is a need for a system and method of efficiently detecting and reporting network failure within an optical network.

In an optical communications system, maintenance is performed at the optical level. Because an optical signal contains multiple signals having differing wavelengths, a network failure may only affect certain wavelengths within the signal. Therefore, it is important that components within the network, such as optical amplifiers, permit these other wavelengths to travel within the network.

Optical amplifiers, which boost the power of optical signals, are a basic building block for many types of optical systems. For example, fiber optic communications systems transmit information optically at very high speeds over optical fibers. A typical communications system includes a transmitter, an optical fiber, and a receiver. The transmitter incorporates information to be communicated into an optical signal and transmits the optical signal via the optical fiber to the receiver. The receiver recovers the original information from the received optical signal. In these systems, phenomena such as fiber losses, losses due to insertion of components in the transmission path, and splitting of the optical signal may attenuate the optical signal and degrade the corresponding signal-to-noise ratio as the optical signal propagates through the communications system. Optical amplifiers are used to compensate for these attenuations. As another example, receivers typically operate properly only within a relatively narrow range of optical signal power levels; optical amplifiers are used to boost an optical signal to the proper power range for the receiver. Thus, it is important to monitor the power of an optical signal at both the input and output of an amplifier in order to determine how much amplification to provide.

An optical amplifier is used to apply a gain to an optical signal. This gain is measured by the power of the signal leaving the amplifier divided by the power of the signal entering the signal. Therefore, if the signal's gain through an amplifier is greater than one, then the amplifier has amplified (i.e., increased the signal's power) the signal.

In order to ensure that signals are properly transmitted to a destination on an optical network, amplifiers within the network preferably have variable gain. For example, consider a situation in which a trunk line containing fiber amplifiers fails. If certain wavelengths can still be transmitted through the network trunk line during a failure, then fiber amplifiers within the network preferably will be adjusted to avoid applying too high a gain. One approach to controlling the gain on an optical amplifier is based on detecting both the input and output power associated with the amplifier.

One method typically used to detect the input and output power on an optical amplifier is to tap a portion of an optical signal using power couplers before it enters the optical amplifier and after it leaves. These tapped optical signal portions are diverted to optical detectors that covert them to electrical signal. These electrical signals are then analyzed to determine the signal's power at the amplifier input and output. However, the optical signal's strength is reduced by this method. This detection process reduces the strength of the optical signal because of these taps at the input and output of the optical amplifier. The input tap loss is approximately equal to the ratio of the power at the tap port and the power at the input port of the optical amplifier. The output tap is equal to the ratio of the power at the output and the power at the output of the tap port. Thus, the signal has a loss associated with detecting the gain across the amplifier equal to the loss of the first tap plus the loss of the second tap. As optical networks expand and the number of amplifiers increase, these tap losses may drastically effect the efficiency of the network. Therefore, there is a need for a monitoring system that is able to effectively determine power levels of an optical signal before and/or after amplification and still avoid tap losses caused by power couplers.

SUMMARY OF THE INVENTION

The present invention overcomes the deficiencies and limitations of the prior art by providing an optical signal power monitor and lasing SOA gain control system. In particular, the present invention provides an optical power detection system that avoids the use of power couplers or taps by detecting a ballast laser signal emitted from a lasing semiconductor optical amplifier (SOA). The lasing SOA emits the ballast laser signal in response to the amplification of the optical signal.

An optical signal propagates through an amplification path within the lasing SOA causing the signal to be amplified. A laser cavity within the amplification path contains a semiconductor gain medium that is pumped above a lasing threshold for the laser cavity. As a result, lasing occurs producing laser radiation within the laser cavity. This laser radiation operates as a ballast to prevent gain saturation within the laser cavity during the amplification of the optical signal. As a result, the gain within the laser cavity is clamped causing the laser radiation to be emitted as a ballast laser signal in order to avoid saturating the laser cavity gain.

This ballast laser signal corresponds to the strength of the optical signal within the laser cavity because the laser cavity gain is clamped. The present invention utilizes this correlation in order to determine a power level of an optical signal as it propagates through a lasing SOA. Specifically, detectors are placed above the substrate that emits this ballast laser signal. In an embodiment, a detector is placed above the emitting substrate near the input of the lasing SOA. A second detector is placed above the emitting substrate near the output of the lasing SOA. The first detector converts the ballast laser signal to a first electrical signal corresponding to the optical signal near the input. The second detector converts the ballast laser signal to a second electrical signal corresponding to the optical signal near the output. These two signals may be analyzed to determine the optical signal power at the input and output as well as used to calculate a gain across the lasing SOA.

In response to determining the optical signal power, the gain of a tunable-gain lasing SOA or a multi-stage lasing SOA may be adjusted to optimize the optical signal strength as it propagates through a network. A tunable-gain lasing SOA includes a tunable region in the laser cavity that allows the loss within the laser cavity to be adjusted. Because the gain of the lasing SOA is clamped, the magnitude of the laser cavity loss controls the gain within the laser cavity. As a result, the gain across the lasing SOA may be dynamically adjusted. A multi-stage lasing SOA comprises multiple lasing SOAs coupled in series and may include tunable-gain lasing SOAs. The gain across multi-stage lasing SOAs is approximately equal to the sum of the gain for each of the connected lasing SOAs. This gain may be adjusted by tuning various lasing SOAs on or off. Additionally, if tunable-gain lasing VLSOAs are used, then the multi-stage lasing SOA gain may be adjusted by controlling the gain on the tunable-gain lasing VLSOAs.

A terminal on a network may control the adjustment of a lasing SOA gain dynamically, thereby reducing the time required for a network manager to monitor the network. Additionally, this terminal may generate various warnings if an optical signal power is outside an optimal range. Finally, the gain across lasing SOAs may be easily increased in order to compensate for the insertion of additional channels within the network or a physical build-out of the network.

BRIEF DESCRIPTION OF THE DRAWINGS

The teachings of the present invention can be readily understood by considering the following detailed description in conjunction with the accompanying drawings. The drawings are not necessarily done to scale.

DETAILED DESCRIPTION OF EMBODIMENTS

In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

A. Conventional Optical Amplifiers

Figure 1:
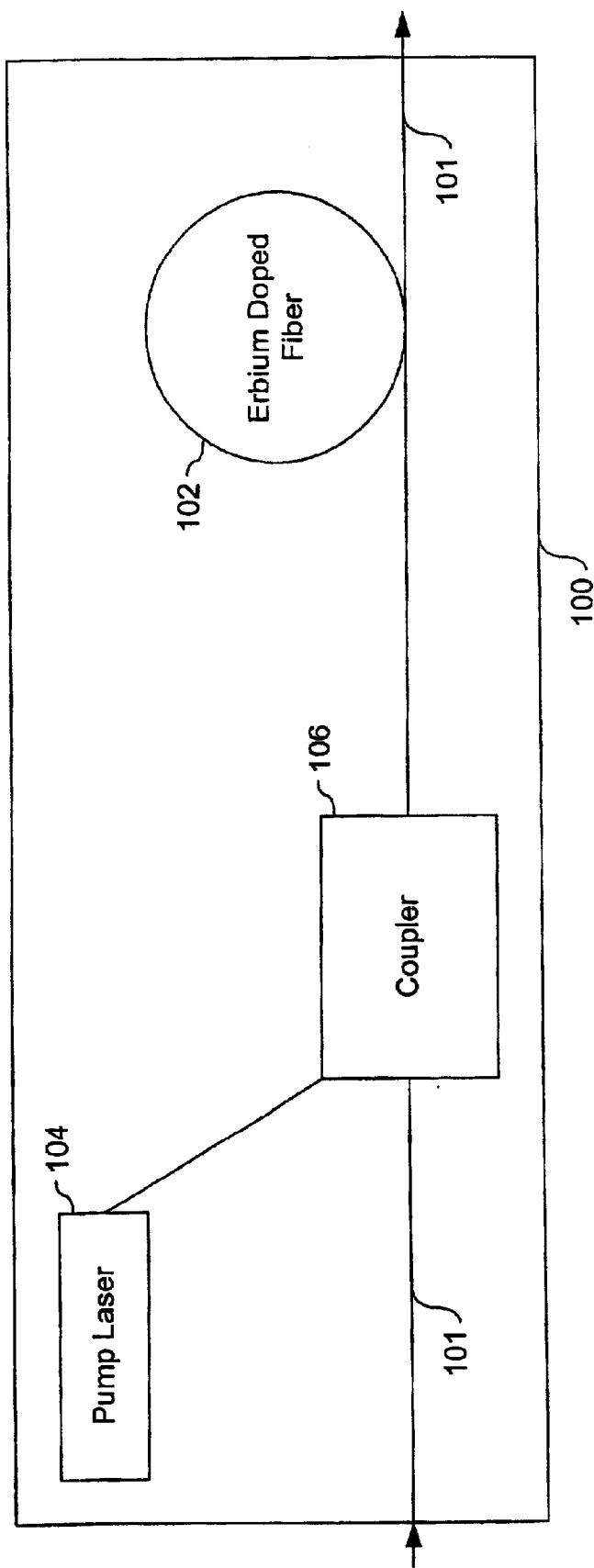
FIG. 1 is a schematic diagram of an erbium doped fiber amplifier (EDFA) 100.

FIG. 1 is a block diagram of an erbium doped fiber amplifier (EDFA) 100. The EDFA 100 typically includes about 20 meters of erbium-doped fiber 102 inserted into the fiber optics. A pump laser 104 provides light to excite the ions in the erbium-doped fiber 102, and a wavelength coupler 106 couples the light from the pump laser 104 to the fiber optics 101. The doped fiber 102 is pumped so that electrons within the dopant are excited into higher energy orbitals. The pump typically is an optical source whose wavelength is preferentially absorbed by the ions and yet different from the optical signal to be amplified. The optical signal is input from un-doped fiber to the doped fiber, experiences gain due to stimulated emission of photons by electrons falling from higher energy orbitals as the optical signal passes through the doped fiber, and then is output in amplified form from the doped fiber to further un-doped fiber.

Fiber amplifiers are limited in the environment in which they may be used. For example, fiber amplifiers can only amplify a narrow range of wavelengths that they can amplify, thereby requiring fiber amplifiers to be cascaded when wider wavelength bands are amplified. Additionally, fiber amplifiers have a transient response to channel dropout in wavelength division multiplexing systems. Finally, fiber amplifiers are relatively large, unable to provide high switching speeds, consume a large amount of power, difficult to mass produce, and costly.

Figure 2:
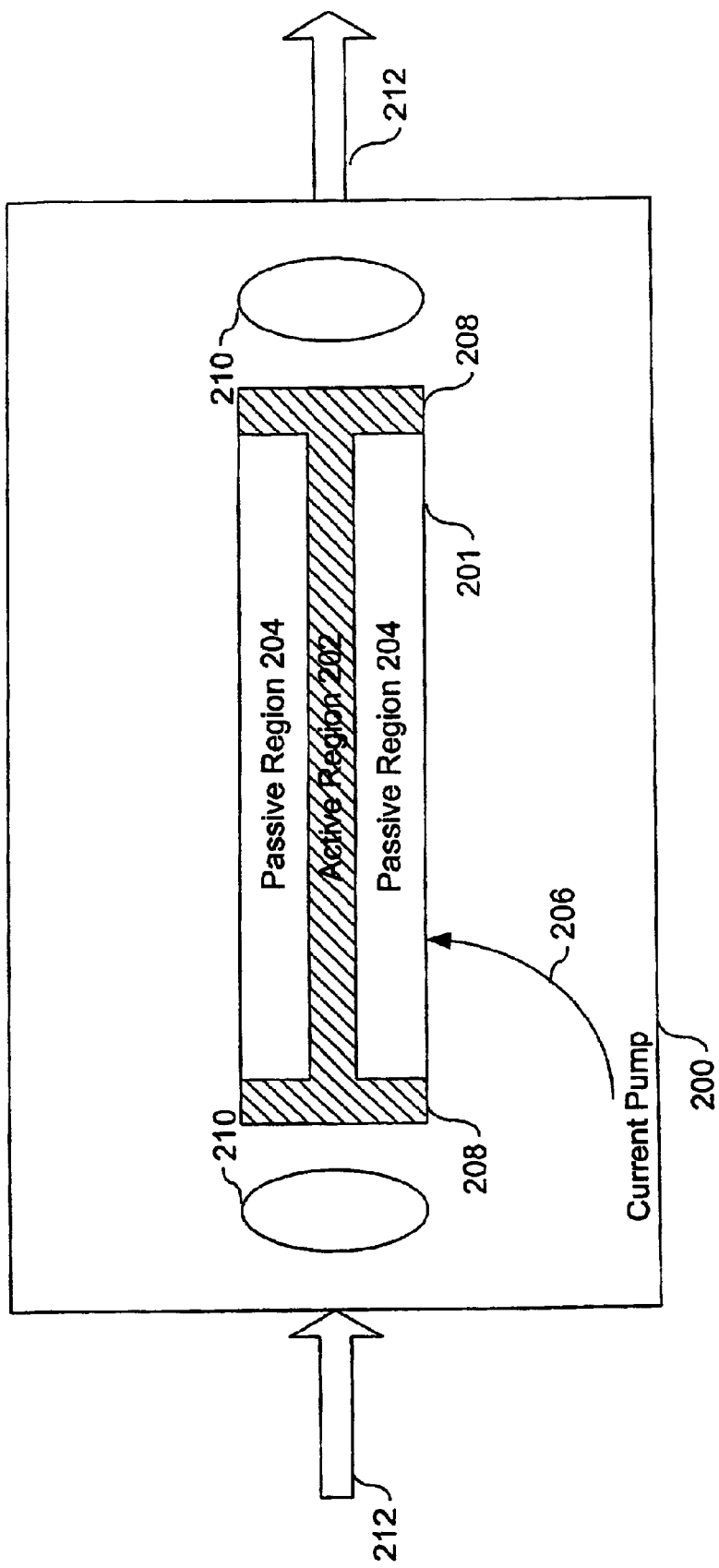
FIG. 2 is a schematic diagram of a conventional semiconductor optical amplifier (SOA) 200.

FIG. 2 is a block diagram of a conventional semiconductor optical amplifier (SOA) 200. The conventional SOA 200 comprises a semiconductor part 201 having an active region 202 and passive regions 204. The active region 202 comprises a semiconductor gain medium that amplifies an optical signal as it passes through the SOA 200. The passive regions 204 comprise wide band-gap semiconductor cladding regions that restrict the optical signal to the higher index of refraction active region 202. The edges of the semiconductor part 201 have antireflection coatings 208 that ensure the semiconductor part 201 operates below a lasing threshold. The SOA 200 is coupled to fiber optics by lenses 210 designed to direct light into the semiconductor part 201.

Like fiber amplifiers, conventional SOAs are limited in the environment in which they may be used. For example, conventional SOA 200 have problems with gain variation and crosstalk induced by the input signal. Avoiding crosstalk is especially important for wavelength division multiplexing (WDM) applications, but it is also important due to intersymbol interference in time-division multiplexing (TDM) applications and due to harmonic distortion in radio frequency (RF) applications. In addition, carrier lifetime in the conventional SOA 200 is limited to on the order of 1 nanosecond which gives rise to significant TDM crosstalk near 1 GHz and higher, and significant WDM crosstalk up to 1 GHz and higher (note that stimulated emission may speed up the reaction time of the gain medium). However, data rates on the order of magnitude of 1 GHz and higher are becoming very significant for current and future optical communications.

B. Non-Tunable VLSOA

Figure 3:
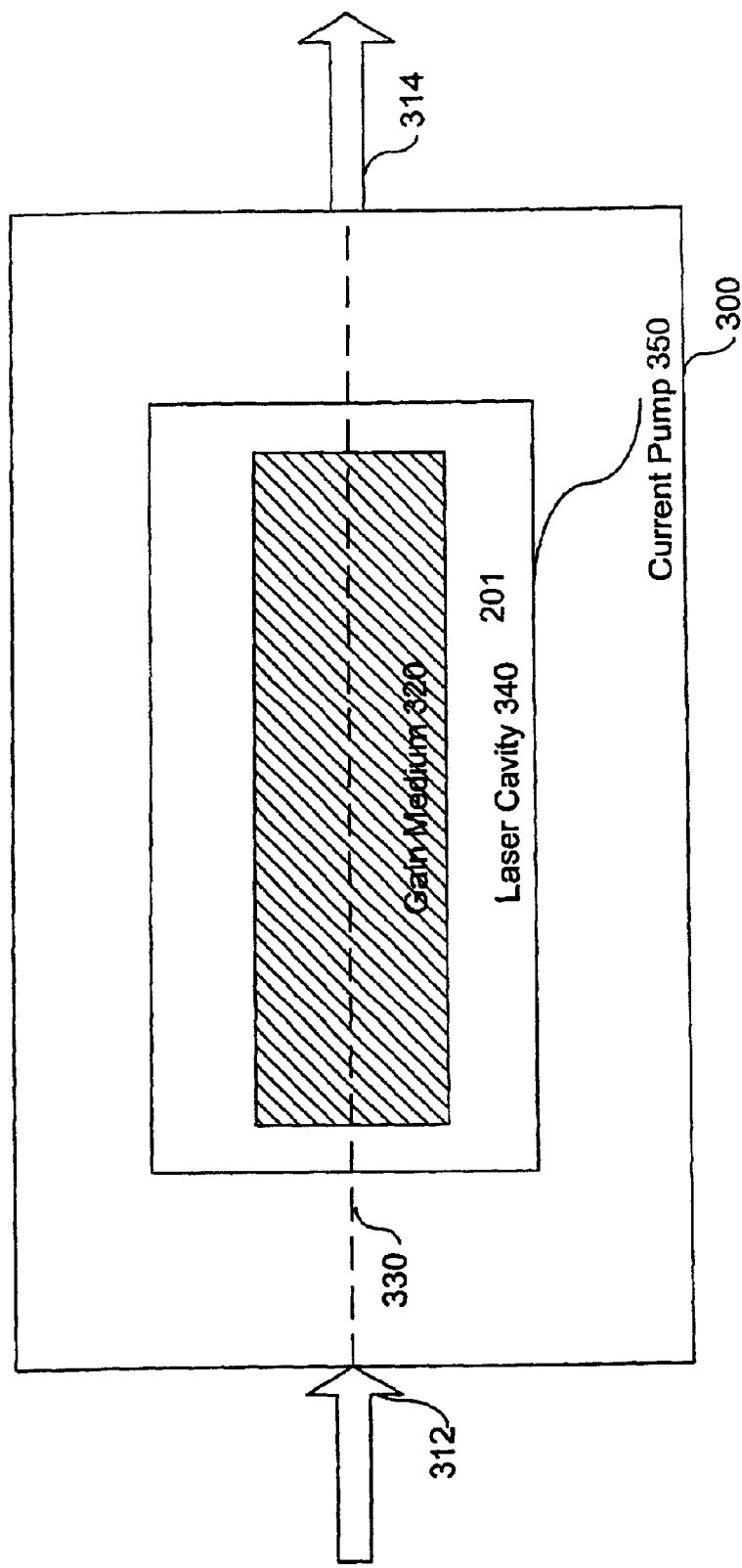
FIG. 3 is a diagram of a lasing semiconductor optical amplifier according to the present invention.

FIG. 3 is a diagram of a vertical lasing semiconductor optical amplifier (VLSOA) 300 in accordance with the present invention. The VLSOA 300 has an input 312 and an output 314. The VLSOA 300 further includes a semiconductor gain medium 320, with an amplifying path 330 coupled between the input 312 and the output 314 of the VLSOA 300 and traveling through the semiconductor gain medium 320. The VLSOA 300 further includes a laser cavity 340 including the semiconductor gain medium 320, and a pump input 350 coupled to the semiconductor gain medium 320. The laser cavity 340 is oriented vertically with respect to the amplifying path 330. The pump input 350 is for receiving a pump to pump the semiconductor gain medium 320 above a lasing threshold for the laser cavity 340.

Figure 4:
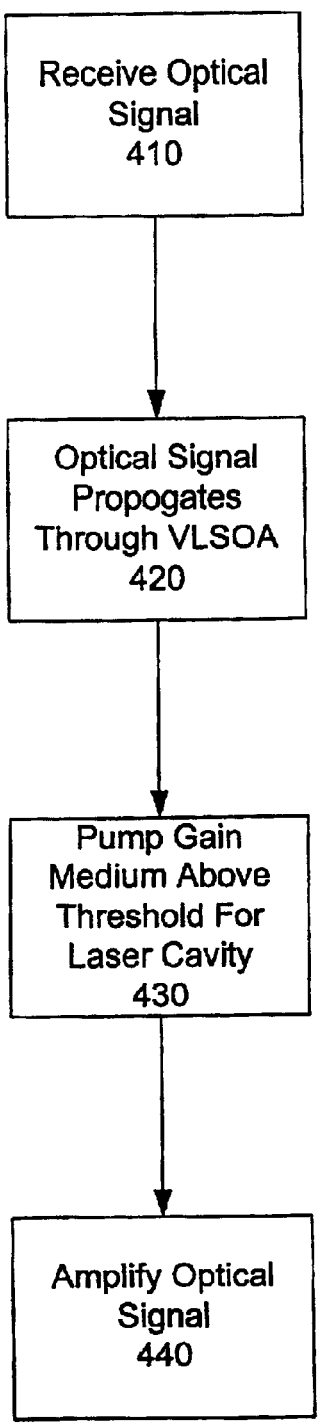
FIG. 4 is a flowchart showing the operation of a lasing SOA used as an amplifier.

FIG. 4 is a flow diagram illustrating operation of VLSOA 300 when it is used as an amplifier. The VLSOA 300 receives 410 an optical signal at its input 312. The optical signal propagates 420 along the amplifying path 330. The pump received at pump input 350 pumps 430 the semiconductor gain medium above a lasing threshold for the laser cavity 340. When lasing occurs, the round-trip gain offsets the round-trip losses for the laser cavity 340. In other words, the gain of the semiconductor gain medium 320 is clamped to the gain value necessary to offset the round-trip losses. The optical signal is amplified 440 according to this gain value as it propagates along the amplifying path 330 (i.e., through the semiconductor gain medium 320). The amplified signal exits the VLSOA 300 via the output 314.

Note that the gain experienced by the optical signal as it propagates through the VLSOA 300 is determined in part by the gain value of the semiconductor gain medium 320 (it is also determined, for example, by the length of the amplifying path 330) and this gain value, in turn, is determined primarily by the lasing threshold for the laser cavity 340. In particular, the gain experienced by the optical signal as it propagates through each VLSOA 300 is substantially independent of the amplitude of the optical signal. This is in direct contrast to the situation with non-lasing SOAs and overcomes the distortion and cross-talk disadvantages typical of non-lasing SOAs.

Figure 5A:
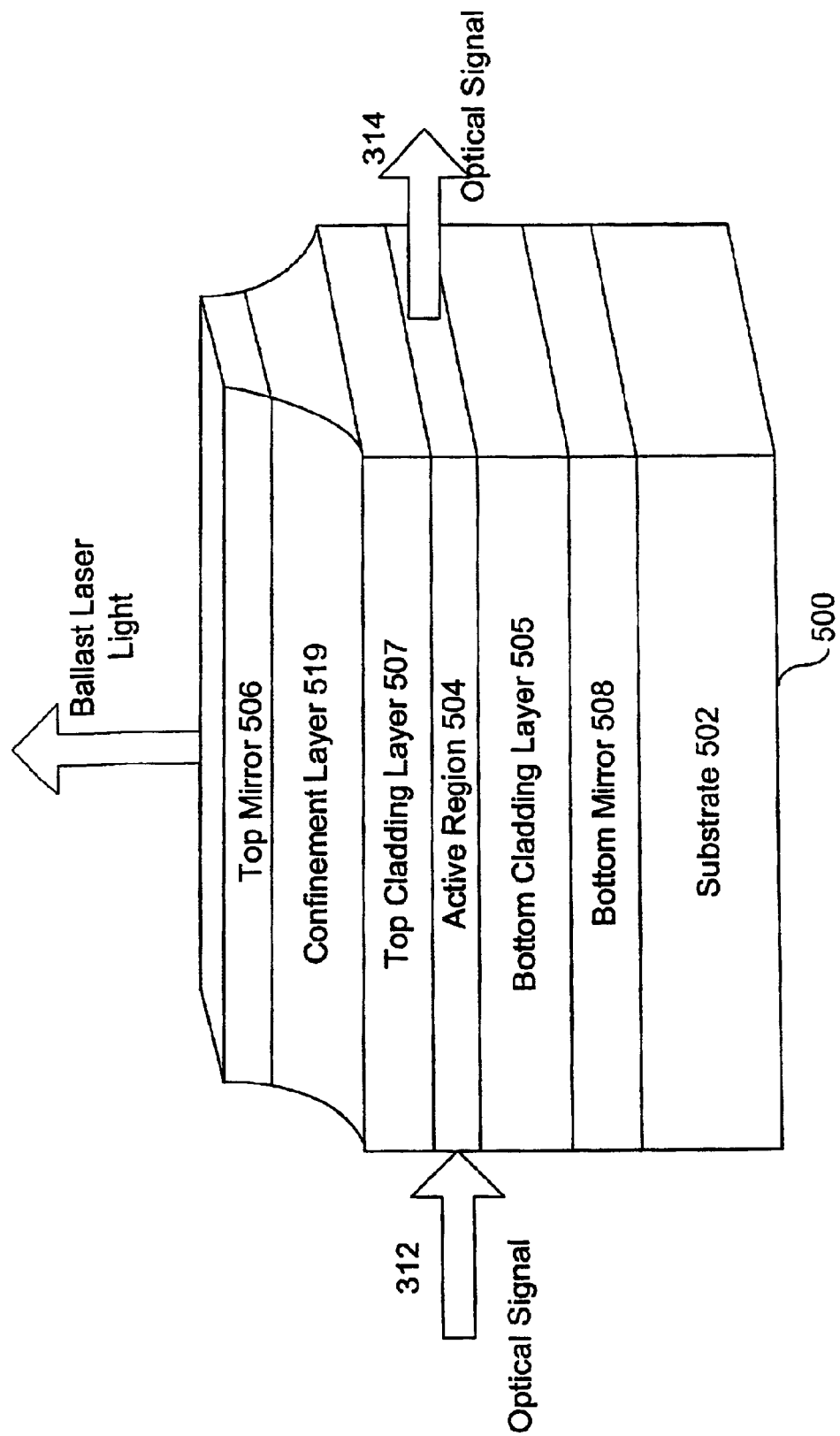
FIG. 5A is a perspective view of an embodiment of a VLSOA.
Figure 5B:
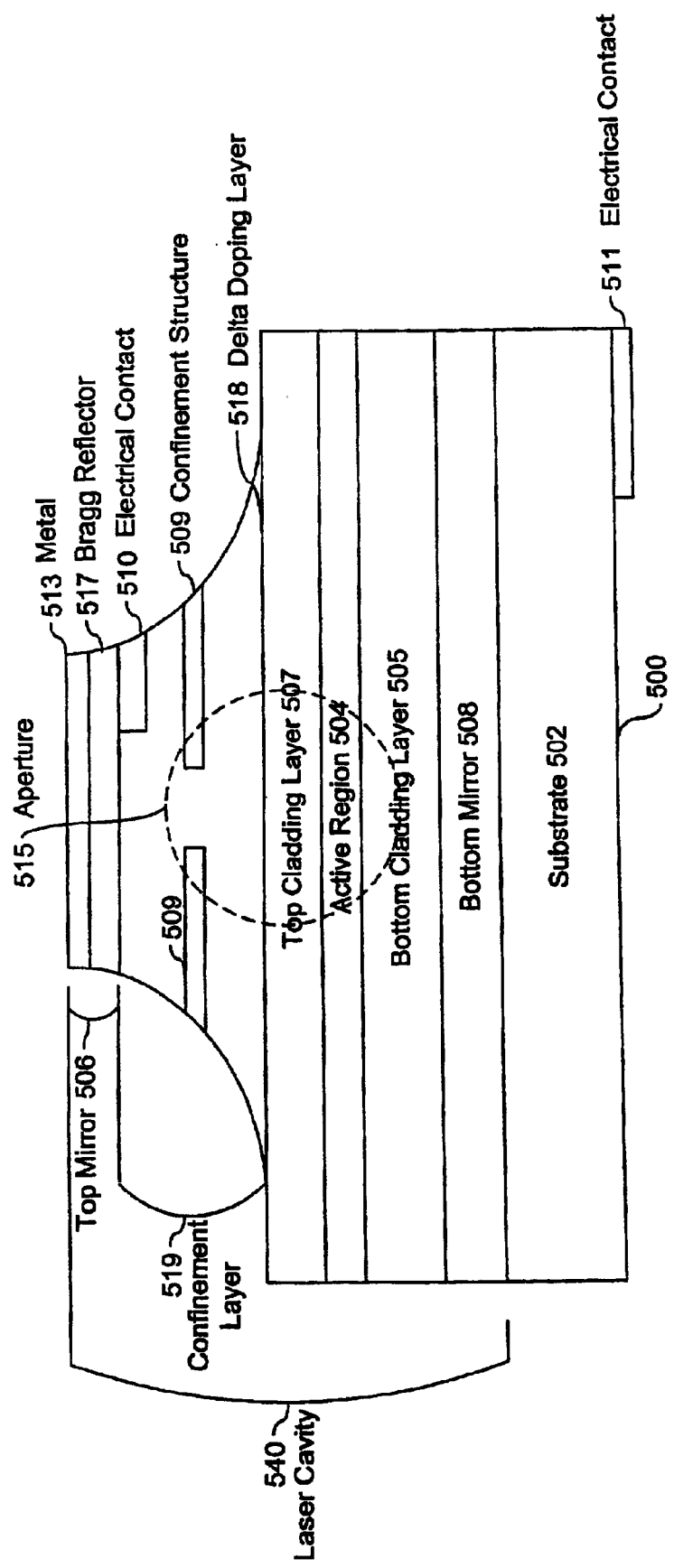
FIG. 5B is a detailed transverse cross-sectional view of an embodiment of a VLSOA.
Figure 5C:
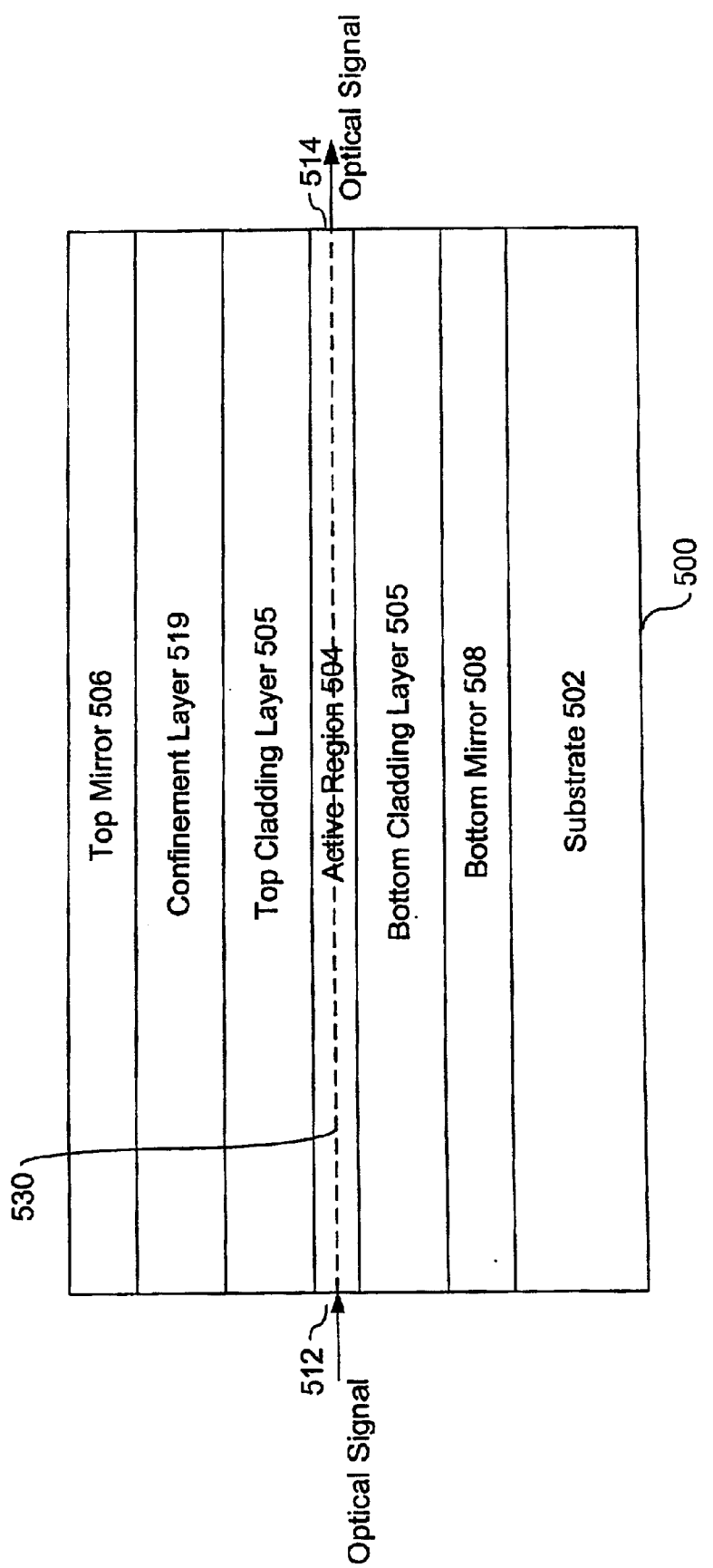
FIG. 5C is a longitudinal cross-sectional view of an embodiment of a VLSOA.

FIGS. 5A–5C are a perspective view, transverse cross-section, and longitudinal cross-section, respectively, of an embodiment of a VLSOA 500 according to the present invention, with FIG. 5B showing the most detail.

Referring to FIG. 5B and working from bottom to top in the vertical direction (i.e., working away from the substrate 502), VLSOA 500 includes a bottom mirror 508, bottom cladding layer 505, active region 504, top cladding layer 507, confinement layer 519, and a top mirror 506. The bottom cladding layer 505, active region 504, top cladding layer 507, and confinement layer 519 are in electrical contact with each other and may be in direct physical contact as well. An optional delta doping layer 518 is located between the top cladding layer 507 and confinement layer 519. The confinement layer 519 includes a confinement structure 509, which forms aperture 515. The VLSOA 500 also includes an electrical contact 510 located above the confinement structure 509, and a second electrical contact 511 formed on the bottom side of substrate 502.

Comparing to FIG. 3, the semiconductor gain medium 320 includes the active region 504 and the laser cavity 340 is formed primarily by the two mirrors 506 and 508 and the active region 504. This embodiment is electrically pumped so the pump input 350 includes the electrical contacts 510,511.

VLSOA 500 is a vertical lasing semiconductor optical amplifier since the laser cavity 540 is a vertical laser cavity. That is, it is oriented vertically with respect to the amplifying path 530 and substrate 502. The VLSOA 500 preferably is long in the longitudinal direction, allowing for a long amplifying path 530 and, therefore, more amplification. The entire VLSOA 500 is an integral structure formed on a single substrate 502 and may be integrated with other optical elements. In most cases, optical elements which are coupled directly to VLSOA 500 will be coupled to the amplifying path 530 within the VLSOA. Depending on the manner of integration, the optical input 512 and output 514 may not exist as a distinct structure or facet but may simply be the boundary between the VLSOA 500 and other optical elements. Furthermore, although this disclosure discusses the VLSOA 500 primarily as a single device, the teachings herein apply equally to arrays of devices.

VLSOA 500 extends primarily in the vertical direction, allowing the VLSOA 500 to be fabricated using standard semiconductor fabrication techniques, preferably including organo-metallic vapor phase epitaxy (OMVPE) or organo-metallic chemical vapor deposition (OMCVD). Other common fabrication techniques include molecular beam epitaxy (MBE), liquid phase epitaxy (LPE), photolithography, e-beam evaporation, sputter deposition, wet and dry etching, wafer bonding, ion implantation, wet oxidation, and rapid thermal annealing, among others.

In more detail, in this embodiment, the substrate 502 is n-doped InP (n-InP), the bottom cladding layer 505 is n-InP, the top cladding layer 507 is p-doped InP (p-InP), and the confinement layer 519 is p-GaAs/AlGaAs. The switch from p-InP in top cladding layer 507 to p-GaAs in confinement layer 519 facilitates the construction of features such as the confinement structure 509 and top mirror 506. GaAs, however, is not lattice-matched to InP, resulting in unwanted electrical effects. The delta doping layer 518, which in this embodiment is a p-type Beryllium (p-Be) doping, counteracts these unwanted electrical effects.

The optical signal amplified by the VLSOA 500 is confined in the vertical direction by index differences between bottom cladding 505, active region 504, and top cladding 507, and to a lesser extent by index differences between the substrate 502, bottom mirror 508, confinement layer 519, and top mirror 506. Specifically, active region 504 has the higher index and therefore acts as a waveguide core with respect to cladding layers 505,507. The optical signal is confined in the transverse direction by index differences between the confinement structure 509 and the resulting aperture 515. Specifically, aperture 515 has a higher index of refraction than confinement structure 509. As a result, the mode of the optical signal to be amplified is generally concentrated in dashed region 521. The amplifying path 530 is through the active region 504 in the direction in/out of the plane of the paper with respect to FIG. 5B.

The active region 504 in embodiment 500 includes a double heterostructure (DH) of p-InAlAs/I-InAlGaAs/n-InAlAs. In other embodiments, the active region 504 may comprise a multiple quantum well (MQW) active region. MQW structures include several quantum wells and quantum wells have the advantage of enabling the formation of lasers with relatively low threshold currents. Both double heterostructures and quantum wells may be fabricated using various materials systems, including for example InAlGaAs on InP substrates, InGaAsP on InP, GaInNAs on GaAs, InGaAs on ternary substrates, and GaAsSb on GaAs. An embodiment uses InAlGaAs grown on an InP substrate. GaAs, InGaAs, or InAlGaAs on GaAs; or nitride material systems may also be suitable. Alternatively, the active region 504 may comprise a single quantum well.

The choice of materials system will depend in part on the wavelength of the optical signal to be amplified, which in turn will depend on the application. Wavelengths in the approximately 1.3–1.6 micron region are currently preferred for telecommunications applications, due to the spectral properties of optical fibers. The approximately 1.28–1.35 micron region is currently also preferred for data communications over single mode fiber, with the approximately 0.8–1.1 micron region being an alternate wavelength region. The term "optical" is meant to include all of these wavelength regions. In an embodiment, the VLSOA 500 is optimized for the 1.55 micron window.

In one embodiment, the active region 504 includes a multiple quantum well (MQW) active region. MQW structures include several quantum wells and quantum wells have the advantage of enabling the formation of lasers with relatively low threshold currents. In alternate embodiments, the active region 504 may instead be based on a single quantum well or a double-heterostructure active region. The active region 504 may be based on various materials systems, including for example InGaAs on InP substrates, InAlGaAs on GaAs, InGaAsP on InP, GaInNAs on GaAs, InGaAs on ternary substrates, and GaAsSb on GaAs. Nitride material systems are also suitable. The materials for bottom and top cladding layers 505 and 507 will depend in part on the composition of active region 504.

Examples of top and bottom mirrors 506 and 508 include Bragg reflectors and non-Bragg reflectors such as metallic mirrors. Bottom mirror 508 in FIG. 5 is shown as a Bragg reflector. Top mirror 506 is depicted as a hybrid mirror, consisting of a Bragg reflector 517 followed by a metallic mirror 513. Bragg reflectors may be fabricated using various materials systems, including for example, alternating layers of GaAs and AlAs, $Sio_2$ and $TiO_2$, InAlGaAs and InAlAs, InGaAsP and InP, AlGaAsSb and AlAsSb or GaAs and AlGaAs. Gold is one material suitable for metallic mirrors. The electrical contacts 510 and 511 are metals that form an ohmic contact with the semiconductor material. Commonly used metals include titanium, platinum, nickel, germanium, gold, palladium, and aluminum. In this embodiment, the laser cavity is electrically pumped by injecting a pump current via the electrical contacts 510 and 511 into the active region 504. In particular, contact 510 is a p-type contact to inject holes into active region 504, and contact 511 is an n-type contact to inject electrons into active region 504. Contact 510 is located above the semiconductor structure (i.e., above confinement layer 519 and the semiconductor part of Bragg reflector 517, if any) and below the dielectric part of Bragg reflector 517, if any. For simplicity, in FIG. 5, contact 510 is shown located between the confinement layer 519 and Bragg reflector 517, which would be the case if Bragg reflector 517 were entirely dielectric. VLSOA 500 may have a number of isolated electrical contacts 510 to allow for independent pumping within the amplifier. This is advantageous because VLSOA 500 is long in the longitudinal direction and independent pumping allows, for example, different voltages to be maintained at different points along the VLSOA. Alternately, the contacts 510 may be doped to have a finite resistance or may be separated by finite resistances, rather than electrically isolated.

Confinement structure 509 is formed by wet oxidizing the confinement layer 519. The confinement structure 509 has a lower index of refraction than aperture 515. Hence, the effective cross-sectional size of laser cavity 540 is determined in part by aperture 515. In other words, the confinement structure 509 provides lateral confinement of the optical mode of laser cavity 540. In this embodiment, the confinement structure 509 also has a lower conductivity than aperture 515. Thus, pump current injected through electrical contact 510 will be channeled through aperture 515, increasing the spatial overlap with optical signal 521. In other words, the confinement structure 509 also provides electrical confinement of the pump current.

The integration of VLSOAs with other optical elements may be implemented using any number of techniques. In one approach, both the VLSOA and the other optical element are formed using a common fabrication process on a common substrate, but with at least one parameter varying between the VLSOA and the optical element. For example, selective area epitaxy (SAE) and impurity induced disordering (IID) are two fabrication processes which may be used in this manner.

In one approach based on SAE, a nitride or oxide SAE mask is placed over selected areas of the substrate. Material is deposited on the masked substrate. The SAE mask results in a difference between the transition energy (e.g., the bandgap energy) of the material deposited on a first unmasked area of the substrate and the transition energy of the material deposited on a second unmasked area of the substrate. For example, the material deposited on the first unmasked area might form part of the active region of the VLSOA and the material deposited on the second unmasked area might form part of the core of a waveguide, with the difference in transition energy accounting for the different optical properties of the active region and the transparent core. SAE is particularly advantageous because it results in a smooth interface between optical elements and therefore reduces optical scattering at this interface. This, in turn, reduces both parasitic lasing modes and gain ripple. Furthermore, the SAE approach can be confined to only the minimum number of layers necessary (e.g., only the active region), thus minimizing the impact on the rest of the integrated optical device.

In a different approach based on IID, an IID mask is placed over selected areas of the substrate. The masked substrate is bombarded with impurities, such as silicon or zinc, and subsequently annealed to cause disordering and intermixing of the materials in the bombarded region. The IID mask results in a difference between the transition energy of the material underlying a masked area of the substrate and the transition energy of the material underlying an unmasked area of the substrate. Continuing the previous example, the masked area might form part of the VLSOA active region and the unmasked area might form part of the core of a waveguide, with the difference in transition energy again accounting for the different optical properties.

In the previous SAE and IID examples, the difference in transition energy results in different optical properties between the VLSOA active region and a waveguide. Engineering the transition energy may also be used to fabricate many other types of integrated optical devices. For example, changing the transition energy between two VLSOAs can be used to optimize each VLSOA for a different wavelength region. In this way, the transition energy in a VLSOA could be graded in a controlled way to broaden, flatten, and shape the gain profile. Alternately, two different elements, such as a VLSOA and a laser source might require different transition energies for optimal performance. Other embodiments will be apparent.

In a different approach, the VLSOA and the optical element are formed on a common substrate but using different fabrication processes. In one example, a VLSOA is formed on the common substrate in part by depositing a first set of materials on the substrate. Next, the deposited material is removed from selected areas of the substrate, for example by an etching process. A second set of materials is deposited in the selected areas to form in part the optical element. Etch and fill is one process which follows this approach. Continuing the VLSOA and waveguide example from above, materials are deposited to form the VLSOA (or at least a portion of the VLSOA). In the areas where the waveguide is to be located, these materials are removed and additional materials are deposited to form the waveguide (or at least a portion of it).

In yet another approach, the VLSOA and the optical element are formed on separate substrates by separate fabrication processes and then integrated onto a common substrate. Planar lightwave circuitry and silicon optical bench are two examples of processes following this approach. In one example, the VLSOA is formed on a first substrate. The optical element is formed on a second substrate. The VLSOA and the optical element are then integrated onto a common substrate, which could be the first substrate, the second substrate or a completely different substrate.

In an embodiment, the bottom mirror 508 is a Bragg reflector formed by either alternating layers of InAlGaAs and InAlAs, alternating layers of InGaAsP and InP, alternating layers of GaAs and AlGaAs, or alternating layers of AlGaAsSb and AlAsSb. Top mirror 506 is a hybrid mirror, which combines a number of layers of a Bragg reflector 517 is (specifically, alternating layers of GaAs and AlGaAs, and/or alternating layers of Si and $SiO_2$) followed by a metallic mirror 513 (specifically, gold). The mirrors 506 and 508 may comprise other types of Bragg reflectors or other types of non-Bragg mirrors. They typically will have reflectivities in the range of approximately 95–100%. Bragg reflectors are formed by periodic variations of the index of refraction of a medium and can be highly reflective. For example, the Bragg reflector may comprise alternating layers of thicknesses $d_1$ and $d_2$ and refractive indices $n_1$ and $n_2$ such that $n_1 d_1 + n_2 d_2 = \lambda/2$, where $\lambda$ is the wavelength to be reflected. The reflectivity $R = \{[1-(n_1/n_2)^{2N}]/(1+(n_1/n_2)^{2N})\}^2$, where N is the number of periods (pairs) in the Bragg reflector. Reflectivities as high as 99% or more may be achieved. In addition to the ones described above, Bragg reflectors may be fabricated using various materials systems, such as, for example, alternating layers of GaAs and AlAs, or alternating layers of $SiO_2$ and $TiO_2$.

The electrical contacts 510, 511 are metals that form an ohmic contact with the semiconductor material. Commnonly used metals include titanium, platinum, nickel, germanium, gold, palladium, and aluminum. In this embodiment, the laser cavity is electrically pumped by injecting a pump current via the electrical contacts 510, 511 into the active region 504. In particular, contact 510 is a p-type contact to inject holes into active region 504, and contact 511 is an n-type contact to inject electrons into active region 504. Contact 510 is located above the semiconductor structure (i.e., above confinement layer 519 and the semiconductor part of Bragg reflector 517, if any) and below the dielectric part of Bragg reflector 517, if any. For simplicity, in FIG. 5, contact 510 is shown located between the confinement layer 519 and Bragg reflector 517, which would be the case if Bragg reflector 517 were entirely dielectric. VLSOA 500 may have a number of isolated electrical contacts 510 to allow for independent pumping within the amplifier 500. This is advantageous because VLSOA 500 is long in the longitudinal direction and independent pumping allows, for example, different voltages to be maintained at different points along the VLSOA 500. Alternately, the contacts 510 may be doped to have a finite resistance or may be separated by finite resistances, rather than electrically isolated.

Confinement structure 509 is formed by wet oxidizing the confinement layer 519, which consists of GaAs and AlGaAs. The resulting confinement structure 509 is aluminum oxide and the aperture 515 is the unaltered AlGaAs. The confinement structure 509 has a lower index of refraction than aperture 515,. Hence, the effective cross-sectional size of laser cavity 540 is determined in part by aperture 515. In other words, the confinement structure 509 provides lateral confinement of the optical mode of laser cavity 540. In this embodiment, the confinement structure 509 also has a lower conductivity than aperture 515. Thus, pump current injected through electrical contact 510 will be channeled through aperture 515, increasing the spatial overlap with optical signal 521. In other words, the confinement structure 509 also provides electrical confinement of the pump current.

When used as an amplifier, VLSOA 500 operates as follows. Pump current is injected through contacts 510, 511, or, more precisely, holes are injected through contact 510 and electrons through contact 511. These holes and electrons flow to the active region 504, where they increase the carrier density in the active region 504. That is, the pump current is used to pump 430 the active region 504. The pump current is laterally confined by aperture 515 and confinement structure 509. The pump current is sufficiently high to exceed a lasing threshold for vertical cavity 540. As a result, laser radiation is generated by the vertical cavity 540. This laser radiation may be emitted from the vertical cavity, for example, through the top surface 520 or into the substrate 502 or it may be generated but not actually emitted from the VLSOA 500. The laser radiation may lie in the visible, infrared, ultraviolet or other frequency range.

While the laser cavity 540 is operating above the lasing threshold, an optical signal is received 410 at input 512 and propagates 420 through the VLSOA 500 along the amplifying path 530. As the optical signal propagates through the active region 504, the optical signal is amplified 440 by a gain multiplier due to stimulated emission of additional photons. The gain multiplier is substantially constant (i.e., independent of the amplitude of the optical signal) because the laser radiation produced by laser cavity 540 acts as a ballast to prevent gain saturation. That is, when the optical signal is weaker, fewer additional photons are stimulated by the optical signal, but more laser radiation is generated. But when the optical signal is stronger, more additional photons are stimulated by the optical signal, but less laser radiation is generated. Typically, the value of the constant gain multiplier is inversely proportional to the loss of the cavity mirrors 506 and 508. For example, ignoring internal loss, if a 0.2% mirror loss (99.8% reflectivity) results in a gain of 10 dB (10times), then a three times larger 0.6% loss (99.4% reflectivity) would result in a roughly three times larger logarithmic gain of 30 dB (1000 times) for otherwise identical VLSOAs 500. The amplified signal exits the VLSOA 500 at output 514.

C. Power Monitor of Non-Tunable VLSOA

Figure 6:
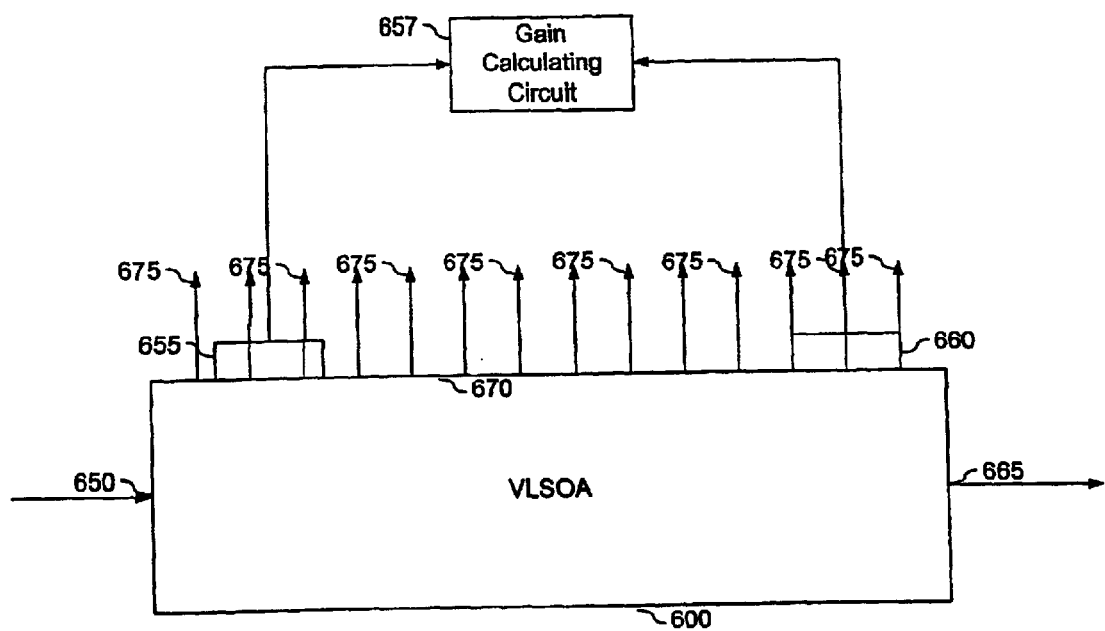
FIG. 6 is a first embodiment of a power monitor including a VLSOA

FIG. 6 shows an embodiment of a power monitor that includes multiple optical detectors attached to a single VLSOA 600. A first detector 655 is positioned on a ballast laser light emitting substrate 670 of the VLSOA 600 near the input 650. A second detector 660 is positioned on the ballast laser light emitting substrate 670 of the VLSOA VLSOA 600 near the output 665. These detectors 655, 660 convert the laser radiation 675 emitted through a laser cavity in the VLSOA 600 to electrical signals. Examples of detectors include avalanche photodiodes and PIN diodes. As described above, this laser radiation 675 acts as a ballast to prevent gain saturation resulting in a relationship between the laser radiation 675 and the strength of an optical signal as it propagates through the VLSOA 600. As a result, a gradient ballast laser light intensity is emitted from the emitting substrate 670 that is indicative of the power level of the optical signal as it travels through the VLSOA 600. For example, if the optical signal is amplified (i.e. gain is greater than 1), then the emitted ballast laser light level will be lower near the output 665 of the VLSOA 600 than at the input 650.

The first detector 655 converts laser radiation near the input 650 of the VLSOA 600 into a first electrical signal. This laser radiation near the input 650 is indicative of the strength of an optical signal as it enters the VLSOA 600. As a result, the first electrical signal may be used to determine an optical signal's power at the input 650 of the VLSOA 600. A second detector 660 converts laser radiation near the output 665 of the VLSOA 600 into a second electrical signal. This laser radiation near the output 665 is indicative of the strength of an optical signal as it leaves the VLSOA 600. As a result, the second electrical signal may be used to determine an optical signal's power at the output 665 of the VLSOA 600.

The first and second electrical signals are transmitted to a gain calculating circuit 657. Using these two electrical signals, the gain calculating circuit 657 determines an optical signal's strength at the VLSOA input and output as well as the gain across the VLSOA 600. This information can then be communicated (e.g., embedding it into overhead of signal) to switching and maintenance components in a network in order to quickly identify malfunctioning or failing optical devices or paths. For example, if the input power is approximately zero, this could mean that no signal is reaching the VLSOA 600 and a path has failed. As a result of this information, a network management system would be able to isolate failures within a maintenance region, often isolating the current problem to a single site. In another example, if the amplifier gain is approximately zero and the input power is normal, this may indicate an amplifier problem. The network can be notified and adjusted accordingly.

The first and second detectors 655, 660 provide gain monitoring of optical components without using power splitters. As a result, the added cost of additional power splitters is avoided as well as a decrease in size because the number of elements is reduced and the elements typically will be closer together. Also, there is no tap loss because power splitters are not used.

The first and second detectors 655, 660 may be positioned above the VLSOA using numerous techniques including the following. First, the detectors may be coupled to the surface 670 above the VLSOA 600 by using bonding pads or other attachment means commonly used within the industry. Second, the detectors may also be integrated with VLSOA 600 as a common structure. One skilled in the art will recognize numerous other techniques for positioning the detectors so that they may detect emitted laser radiation from the VLSOA 600.

D. Tunable-Gain VLSOA

Figure 7A:
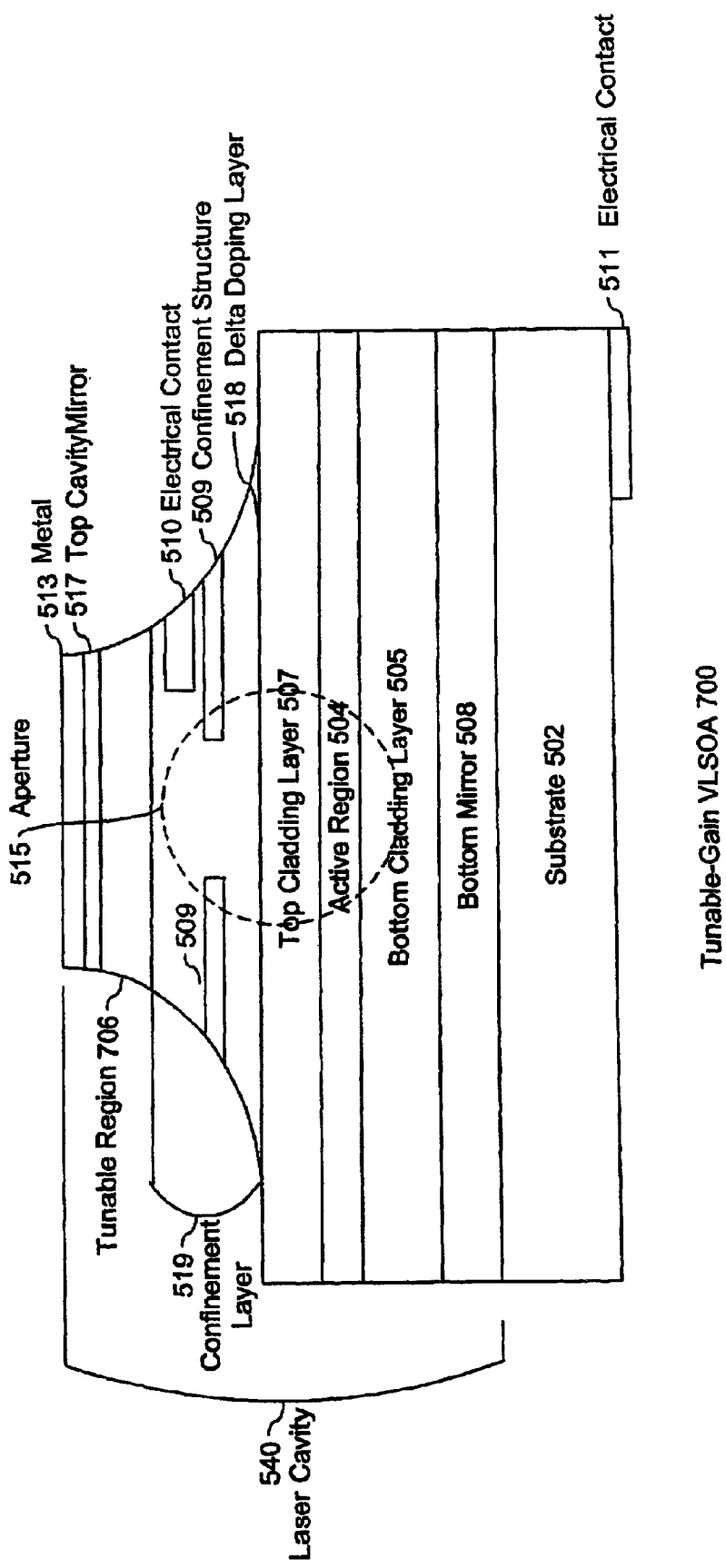
FIG. 7A is a detailed transverse cross-sectional view of a first embodiment of a tunable-gain VLSOA.

FIG. 7A is a cross-sectional diagram of a tunable-gain VLSOA 700 that includes a tunable region 706. The tunable region 706 is positioned between the top cavity mirror 506 and the confinement layer 519. The tunable-gain VLSOA 700 includes the laser cavity 540 comprising the active region 504, the top cavity mirror 506, the bottom cavity mirror 508 and the tunable region 706. The active region 504 comprises a semiconductor gain medium (e.g., multiple quantum well active region). The top cavity mirror 506 and bottom cavity mirror 508 may comprise Bragg reflectors or other types of mirrors operable within a lasing cavity.

As described above, the gain multiplier of the VLSOA 500, 700 is inversely proportional to the cavity loss. In the case of a non-tunable VLSOA 500, this loss is relatively fixed thereby clamping the gain multiplier to a particular value. However, the presence of a tunable region 706 within a tunable-gain VLSOA 700 allows the cavity loss to be adjustable. As a result, the gain multiplier may be tuned by adjusting this cavity loss.

The tunable region 706 and confinement layer 519 are placed between the active region 504 and the top cavity mirror 506. The tunable region 706 may be, for example, a liquid crystal layer whose transmissivity may be tuned by the application of a voltage across the layer. The lower the transmissivity of the tunable region 706, the lower the "effective" reflectivity of the top cavity mirror 506 and hence the higher the constant gain multiplier of the tunable-gain VLSOA 700.

The tunable-gain VLSOA 700 in FIG. 7A is difficult to engineer. First, vertical cavity surface emitting lasers (VCSELs) such as the one in FIG. 7A require high reflectivity mirrors, typically with reflectivities about 99.5% each. The tunable region 706 typically has some loss associated with it due to absorption, diffraction, and scattering. Because of this, it is difficult to engineer the combination of the tunable region 706 and the top mirror 506 such that the composite reflectivity is in the 99.5% range. This is made particularly difficult if electrical pumping is used for the VCSEL in FIG. 7A because the electrical contact typically required between tunable region 706 and top mirror 506 will lead to additional optical loss. Fortunately, the need for such high composite reflectivity may be overcome with the tunable-gain VLSOA designs in FIGS. 8A and 8B.

Second, the tunable-gain VLSOA 700 in FIG. 7A is difficult to engineer because the design in FIG. 7A requires extremely fine control of the tunable region 706 in order to tune the constant gain multiplier of a high gain device. The tunable-gain VLSOA 700 typically requires adjusting one of the mirror reflectivities over the range of 95% to 100%. A typical variation would be about 99.2% to 99.8%. In this case, assuming a fixed loss of 0.2%, the loss introduced by the tunable region 706 needs to vary from about 0% to 0.6% for full tuning of the device. The range of tunable loss introduced by the tunable region 706 is small making the device very sensitive. Fortunately, the need for such fine control may be avoided with the tunable-gain VLSOA designs in FIGS. 8A and 8B.

Third, the tunable-gain VLSOA 700 in FIG. 7A may be difficult to engineer because the tunable region 706 would be limited to using tunable absorption, rather than tunable phase or refractive index, since tunable phase would have a negligible effect in this design.

Fourth, the tunable-gain VLSOA 700 in FIG. 7A may be difficult to engineer because VCSELs have very high optical power intensities between the mirrors 506 and 508, and placing the tunable region 706 inside this cavity will likely lead to saturable absorption problems. For example, the laser power will be high enough to "bleach" carriers in the case where the tunable region is a tunable absorber based on band filling effects in quantum wells. One possible solution to this problem is to place the absorbing wells close to standing wave minima of the optical field, but this significantly decreases desired tuning effect.

Figure 7B:
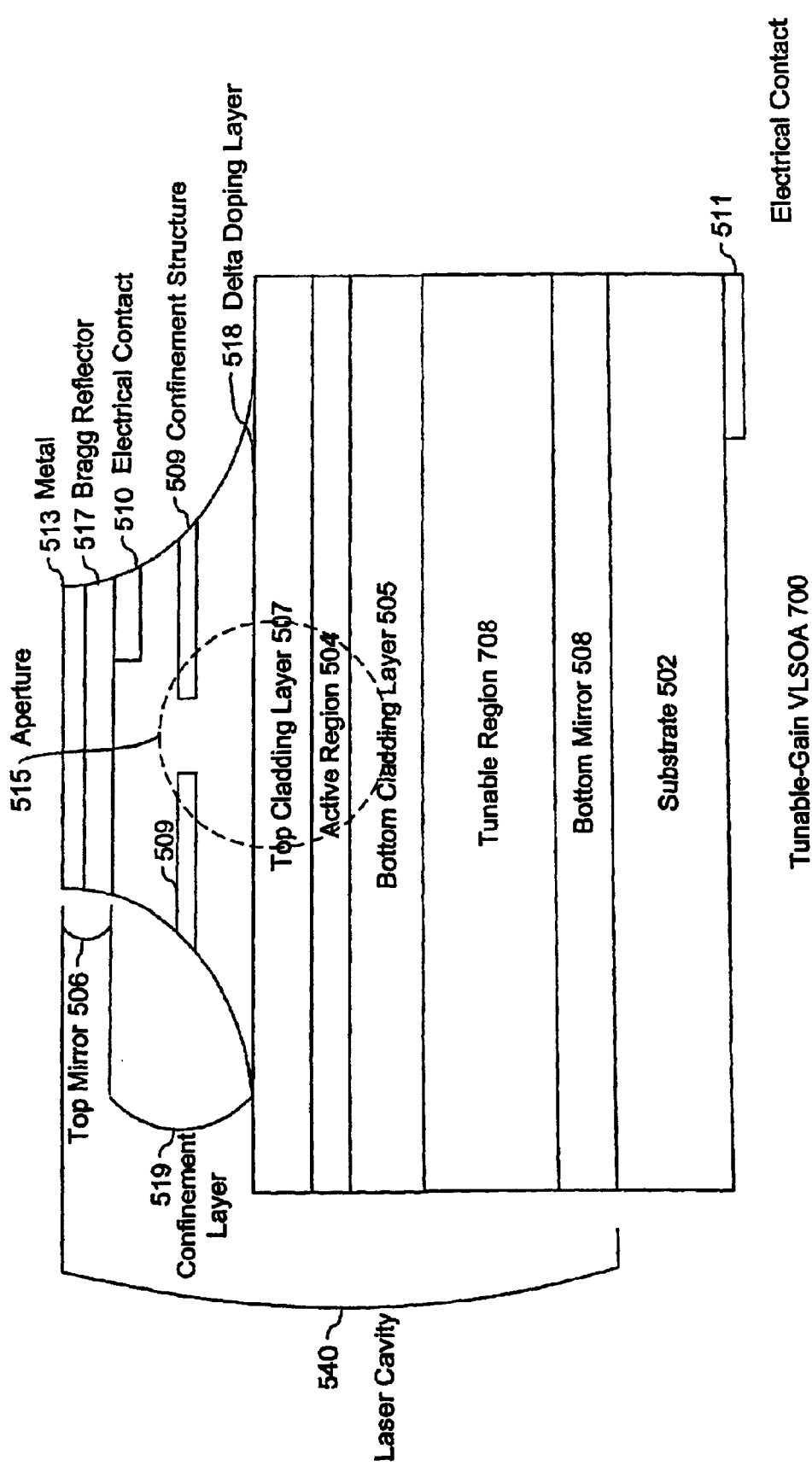
FIG. 7B is a detailed transverse cross-sectional view of a second embodiment of a tunable-gain VLSOA
Figure 8A:
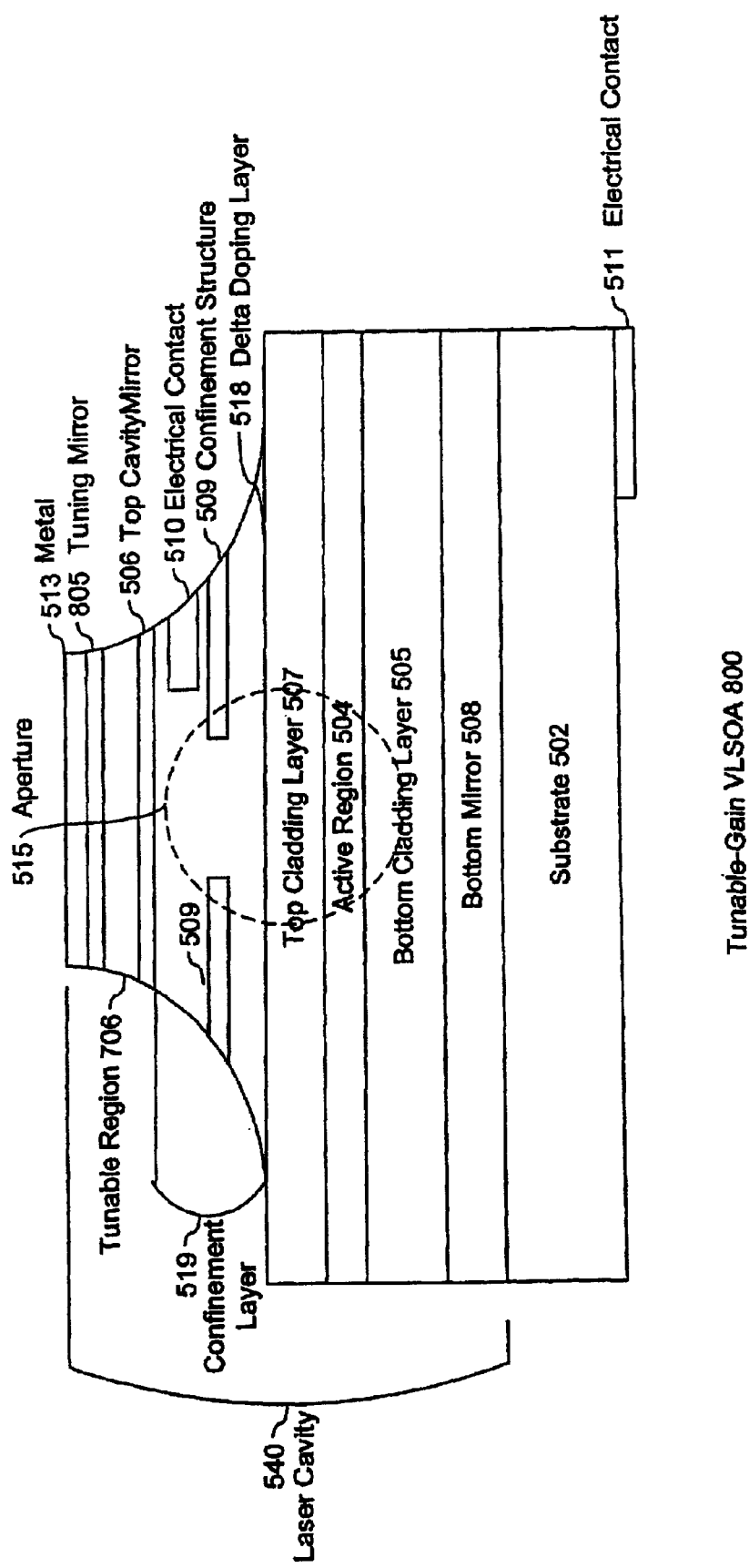
FIG. 8A is a detailed transverse cross-sectional view of a third embodiment of a tunable-gain VLSOA.
Figure 8B:
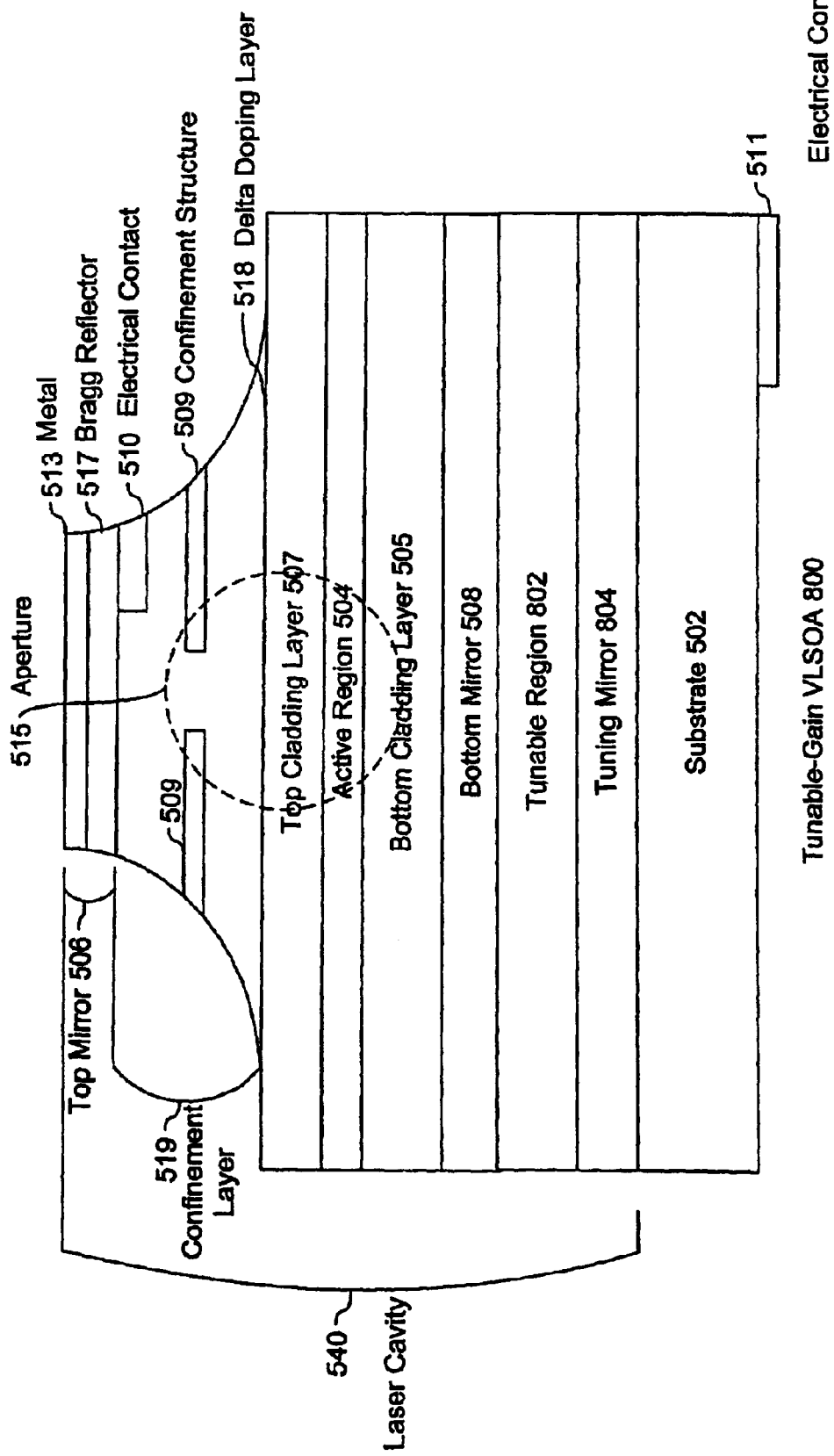
FIG. 8B is a detailed transverse cross-sectional view of a fourth embodiment of a tunable-gain VLSOA.

Fifth, the tunable-gain VLSOA 700 in FIG. 7A may be difficult to engineer because in preferred implementations of the VLSOA 700, if the tunable region 706 uses optical absorption, this absorption layer should be placed in such a way that it interacts with the optical mode of the VCSEL only, and does not interact with the optical mode of the amplified signal. Implementation of this requirement is more difficult in this design than in the tunable-gain VLSOA designs in FIGS. 8A and 8B FIG. 7B is a cross-sectional diagram of another embodiment of the tunable-gain VLSOA 700 including a tunable region 708. The tunable region 708 is positioned between the active region 504 and the bottom mirror 508. In this embodiment, the tunable region 708 is still positioned within the laser cavity, thereby, allowing the cavity loss to be adjusted by adjusting the loss within the tunable region 708. However, this embodiment has the same five limitations discussed above and FIGS. 8A and 8B show tunable-gain VLSOA designs that are more easily constructed and less sensitive.

FIG. 8A is a cross-sectional diagram of a tunable-gain VLSOA 800 which includes a tunable region 706 between a top cavity mirror 506 and an additional tuning mirror 805 according to an embodiment of the present invention. The tunable region 706 may be a liquid crystal layer or another adjustable loss layer. The additional tuning mirror 805 may be a Bragg reflector or another type of mirror.

In comparison to the tunable-gain VLSOA in FIG. 7A, the tunable-gain VLSOA in FIG. 8A moves the tunable region 706 outside of the laser cavity 540, sandwiching the tunable region 706 between the top cavity mirror 506 and the additional tuning mirror 805.

As a result of moving the tunable region 706 outside the laser cavity 540, the need for extremely fine control of the tunable region 706 is avoided. The tunable region 706 and the additional tuning mirror 805 may be integrated into the semiconductor device itself or, alternatively, may be external to the semiconductor device. For example, the additional tuning mirror 805 may be fabricated epitaxially to be part of the semiconductor device, or it may be on positioned on the back surface of the semiconductor wafer.

The effective reflection of the top cavity mirror 506 would depend on the reflectivities of the top cavity mirror and the additional tuning mirror 805, the absorption of the tunable region 706, the thickness of the tunable region 706, and the index of refraction of the tunable region 706. The thickness and index of refraction of the tunable region 706 affects the phase condition between the reflection from the top cavity mirror 506 and the reflection from the additional tuning mirror 805.

The tunable-gain VLSOA 800 in FIG. 8A overcomes the five above-discussed reasons why the tunable-gain VLSOA 700 in FIGS. 7A and 7B may be difficult to engineer. First, the need for high composite reflectivity is overcome because the top mirror 506 may be designed to provide almost all of the reflectivity needed to achieve lasing threshold in the VCSEL and higher losses may be tolerated in the tunable region 706.

Second, the need for extremely fine control of the tunable region 706 is overcome because reflectivities of the top cavity mirror 506 and the additional tuning mirror 805 may be designed such that this corresponds to full tuning of the tunable-gain VLSOA 800 from say 20 dB gain to 30 dB gain. This makes possible designs where the tuning mechanism is, for example, a LCD on top of the VLSOA chip where the loss may vary, for example, from 80% to 100% depending on applied voltage.

Third, the limitation to using tunable absorption in the tunable region 706, rather than tunable phase or refractive index, is overcome by the tunable-gain VLSOA 800 design in FIG. 8A. This is because the VLSOA 800 design in FIG. 8A is a three-mirror design and thus has two optical cavities. The design is thus sensitive to both tunable absorption and tunable phase (change in index of refraction or length).

Fourth, saturable absorption problems due to placing the tunable region 706 inside the VCSEL cavity is overcome by the tunable-gain VLSOA 800 design in FIG. 8A. This is because the VLSOA 800 design in FIG. 8A moves the tunable region 706 away from the center of the VCSEL optical cavity to a position where the optical field intensity is greatly reduced, and thus eliminates the saturable absorption problems for most implementations.

Fifth, problems with the tunable region 706 interacting with the optical mode of the amplified signal is overcome by the VLSOA 800 design in FIG. 8A. This is because the VLSOA 800 design in FIG. 8A moves the tunable region 706 away from the optical mode of the amplified signal which lies primarily in the active region 504.

The index of refraction of the tunable region 706 (and hence the phase difference between the reflections from the top cavity mirror 506 and the additional tuning mirror 805) may be adjusted using physical mechanisms which occur within semiconductor material such as, for example, the thermo-optic effect, the quantum-confined Stark effect, the Franz-Keldysh effect, the Burstein-Moss effect (band filling), the electro-optic effect, and the acousto-optic effect. These effects by themselves are described in various publicly available literature. A tunable region 706 using such physical mechanisms may (optionally) be built directly into a lasing SOA device to make the lasing SOA device tunable. Alternatively, the index of refraction of the tunable region 706 may be adjusted using physical mechanisms which occur external to a semiconductor device such as, for example, a liquid crystal mechanism, an air bridge mechanism which moves or tilts the additional tuning mirror 805, a mechanism to change the curvature of the additional mirror, and a razor-edge or neutral density filter mechanism between the top cavity mirror 506 and the additional tuning mirror 805.

An example of an embodiment of a top structure, comprising the top cavity mirror 506, the tunable region 706, and the tuning mirror 805, of the tunable-gain VLSOA 800 in FIG. 8A is described as follows. In an embodiment, the top cavity mirror 506 is a 20 pair Bragg reflector made of quarter wavelength thick layers in alternation of AlAs (112 nanometers thick for a 1.3 micron wavelength device) and GaAs (96 nanometers thick for a 1.3 micron wavelength device). This top cavity mirror 506 by itself has 99.2% reflectivity and 0.8% transmissivity (for the case where the light is incident from and transmits into GaAs material). By reflecting 10% of the transmitted light back at the top cavity mirror 506 by the tunable region 706 and the additional tuning mirror 805, the effective reflectivity of the bottom structure, comprising the bottom mirror 508 and the substrate 502, should increase from 99.2% to 99.6% according to simulations of the reflectivity. Similarly, by reflecting 20% of the transmitted light, the effective reflectivity of the bottom structure should increase to 99.7%. And, by reflecting 30% of the transmitted light, the effective reflectivity of the bottom structure should increase to 99.8%.

The additional tuning mirror 805 may be curved to reduce diffraction loss and to make alignment easier. The confocal design for the additional tuning mirror 805 does not need to be perfectly parallel with the VCSEL device.

The additional tuning mirror 805 may be placed relatively far away (on the order of 1 cm away in an embodiment) from the VCSEL to reduce the mode spacing of this external cavity (to about 0.1 nm in an embodiment). The reduction in the mode spacing of the external cavity removes a phase requirement for the reflection. A potential disadvantage with this placement of the additional tuning mirror 805 is that the relatively long cavity round trip time and mode-locking effects could limit the speed of the device. Other designs described in this application may be higher in speed.

The tunable region 706 may comprise a variable attenuator made from a neutral density filter wheel or slide. The neutral density wheel or slide may be used to adjust the percent of light reflected back into the cavity. This filter may be placed at an angle such that any light reflecting from its surface does not reflect back into the laser cavity.

FIG. 8B is a cross-sectional diagram of a tunable-gain VLSOA 800 that includes a tunable region 802 between the bottom cavity mirror 508 and an additional tuning mirror 804 according to an embodiment of the present invention. Again, the tunable region 802 may be a liquid crystal layer or another adjustable loss layer, and the additional tuning mirror 804 may be a Bragg reflector or another type of mirror.

The tunable-gain VLSOA 800 in FIG. 8B is similar to the tunable-gain VLSOA in FIG. 8A, except that the tunable region 802 and the additional tuning mirror 804 are moved from above the top cavity mirror 506 to below the bottom cavity mirror 508. For the tunable-gain VLSOA 800 in FIG. 8B, using only relatively rough control of the tunable region 802, fine control is achieved over the effective reflectivity of the bottom cavity mirror 508 and hence over the constant gain multiplier of the tunable-gain VLSOA 800.

An antireflection coating may be applied to the surface of the top cavity mirror 506. This antireflection coating may be used to eliminate the reflection from a GaAs-to-air interface between the top mirror 506 and the air of the external cavity. The 99.2% Bragg reflectivity for the bottom mirror 508 discussed above does not account for the reflection from such a GaAs-to-air interface. Alternatively, a 16 pair Bragg reflector with the GaAs-to-air interface reflection has about the same 99.2% reflectivity and could be used instead of the 20 pair Bragg plus antireflection coating.

Other embodiments of the present invention may be included within a VLSOA in order to adjust the loss within the laser cavity 540. For example, the top cavity mirror's reflectivity may be adjusted by changing the physical characteristics of the mirror. The adjusted top cavity mirror 506 may be, for example, a Bragg reflector whose effective reflectivity has been lowered by ion implantation, by temperature adjustment, by an applied voltage, by decreasing (or increasing) the number of layers of the Bragg reflector, by mechanical deformation of the mirror, by tilting the mirror, by horizontally displacing the mirror, or by some other mechanism. Some mechanisms, such as ion implantation and changing the number of layers in the Bragg reflector may be used to adjust the amplification during manufacture of the tunable-gain VLSOA.

Other mechanisms, such as the temperature adjustment and the applied voltage, may be used to adjust the amplification in the field after manufacture of the tunable-gain VLSOA 800.

For example, ion implantation may be used on a Bragg reflector to form the adjusted top cavity mirror 506. The Bragg reflector may be originally formed such that it had a reflectivity, for example, of about 99.8%. Subsequently, implantation of hydrogen (H) ions, oxygen (O), or iron (Fe) or other species of ions at controlled energies may be used create damage-related or chemical-related optical absorption in the Bragg reflector in order to lower its effective reflectivity to say 99.5%. The change in reflectivity imposed by the ion implantation would depend on the species of ions used and the implant energy, dose and subsequent annealing conditions.

The techniques described above regarding the adjustable top cavity mirror 506 may instead be applied to the bottom mirror 508. Like the adjusted top cavity mirror 506, the adjusted bottom cavity mirror 508 may be, for example, a Bragg reflector whose effective reflectivity has been lowered by ion implantation, by temperature adjustment, by an applied voltage, by decreasing (or increasing) the number of layers of the Bragg reflector, by mechanical deformation of the mirror, by tilting the mirror, by horizontally displacing the mirror, or by some other mechanism.

One skilled in the art will recognize numerous methods in which the loss within the laser cavity may be adjusted. The above-described examples are just a few of these methods and should not limit the scope of the present invention in any manner.

E. Power Monitor and Gain Control of Tunable-Gain VLSOA

Figure 9A:
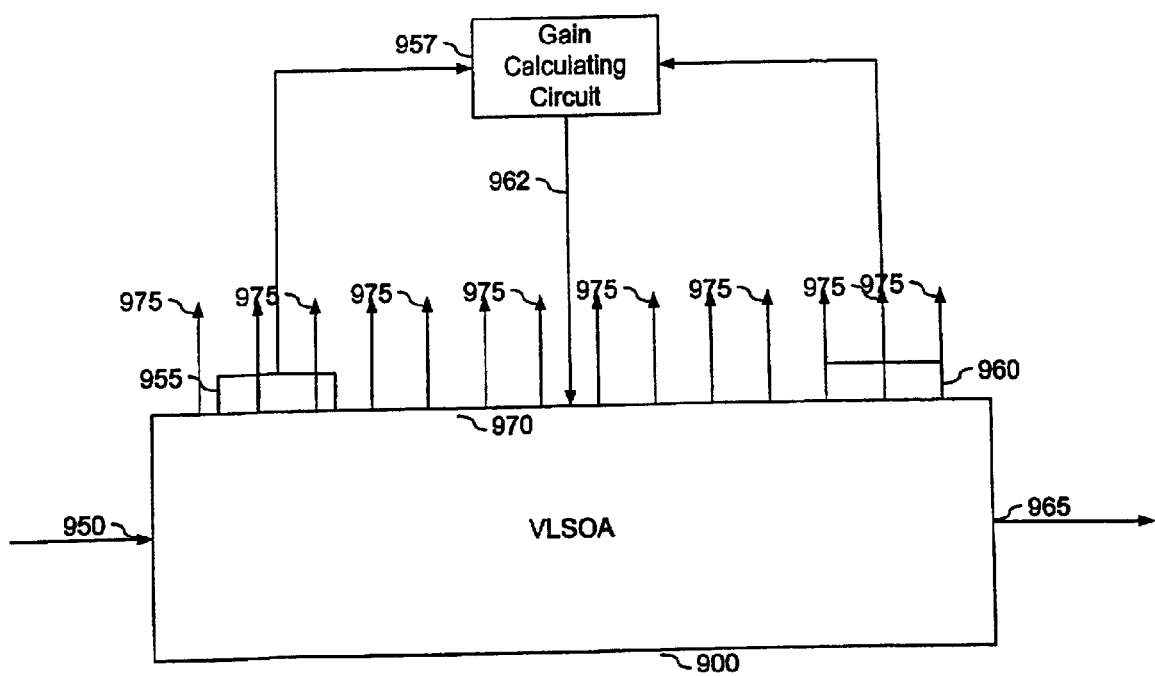
FIG. 9A is a first embodiment of a power monitor and gain control device using a tunable-gain VLSOA

FIG. 9A is a block diagram depicting a power monitor and gain control device on a tunable-gain VLSOA 900 according to an embodiment of the present invention. An optical signal 950 is input into the tunable-gain VLSOA 900 and is amplified. The amplification is gain-clamped and independent of the dynamic strength of the optical signal 950. As previously discussed, when the optical signal 950 is weaker, less additional photons are stimulated by the optical signal 950, but more ballast laser light 975 is output, for example through substrate 970 of the tunable-gain VLSOA 900. When the optical signal 950 is stronger, a greater number of photons are stimulated by the optical signal 950. As a result, less ballast laser light 975 is output through substrate 970. Therefore, a gradient of ballast laser light intensity is emitted from the substrate 970.

In the example of FIG. 9A, detectors 955, 960 are placed directly on the emitting surface 970. These detectors 955, 960 may be coupled to the surface 970 by using bonding pads or other attachment means commonly used within the industry. They may also be integrated in the tunable-gain VLSOA 900 as a common structure. A first detector 955 detects the power of the laser light outputted through the surface 970 near the input of the tunable-gain VLSOA 900. A second detector 960 detects the power of the laser light outputted through the surface 970 near the output of the tunable-gain VLSOA 900. Because of the gain-clamping physics, the power of the signal at the input 950 and output 965 of the tunable-gain VLSOA 900 can be calculated from the detected laser light. The signal's gain can then be calculated by taking the ratio of the power of the output signal 965 to the input signal 950. Thus, the gain may be determined from the laser light received by the first detector 955 and the second detector 960.

In this particular example, a gain calculating circuit 957 is coupled to each of the detectors 955, 960 for determining the gain across the tunable-gain VLSOA 900. The gain calculating circuit 957 may be positioned either on or off the actual VLSOA chip and may operate either in analog or digital format. An example of an analog gain calculating circuit 957 may be an inverted differential op-amp. If the gain calculating circuit 957 operates digitally, then the electrical signals from the detectors 955, 960 are converted from to a digital signal and input into a processor that calculates the gain.

Once the gain of the tunable-gain VLSOA 600 has been calculated, the gain calculating circuit 957 may control the tunable-gain VLSOA 900 via signal 962 to adjust the gain of the tunable-gain VLSOA 600. As described above, this gain adjustment may be accomplished by adjusting the loss of the laser cavity by tuning the tunable region of the tunable-gain VLSOA 600. The gain calculating circuit 957 may be intergrated a VLSOA chip or may be positioned off-chip.

Figure 9B:
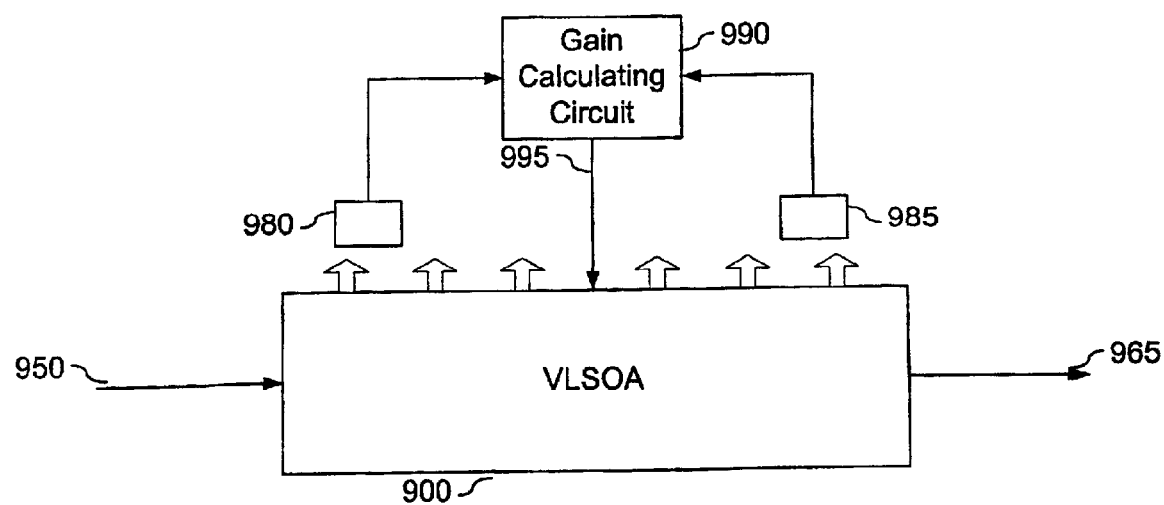
FIG. 9B is a second embodiment of a power monitor and gain control device using a tunable-gain VLSOA.

FIG. 9B depicts another embodiment for using multiple optical detectors which are not in direct contact with the tunable-gain VLSOA 900. An optical signal 950 is input into the active region and proceeds to be amplified as it passes through the active region. As shown in FIG. 9B, detectors 980 and 985 are not in direct contact with the tunable-gain VLSOA 900. A first detector 980 is positioned to detect the laser light generated the input 950. A second detector 985 is positioned to detect the laser light generated near the output 965. In this embodiment (as shown in FIG. 9B), the detectors 980, 985 are physically located above the tunable-gain VLSOA 900 chip so as to receive the laser light. Alternately, they may be located elsewhere, with other optical elements transferring the laser light to the detectors 980, 985. For example, if the detectors 980, 985 are located in a different area of a common substrate, then mirrors and/or waveguides may be used to channel the laser light to the detectors 980, 985. If the detectors 980, 985 are located off-chip, fibers may be a more preferred method for transferring the laser light. The first detector 980 converts the laser light emitted through the surface 970 near the input of the tunable-gain VLSOA 900 to an electrical signal and transmits it to a gain calculating circuit 990. The second detector 985 converts the laser light emitted through the surface 970 near the output of the tunable-gain VLSOA 900 to an electrical signal and transmits it to a gain calculating circuit 990. The gain calculating circuit 990 is coupled to each of the detectors 980, 985 for determining and controlling the gain across the specific tunable-gain VLSOA 900, in the same manner as described with respect to FIG. 9A.

As shown in both FIGS. 9A and 9B, this embodiment of the invention does not use power splitters to monitor the gain of an optical component. As a result, the added cost of additional power splitters is avoided. Also, the size of the device typically decreases because the number of elements is reduced and the elements typically will be closer together. Additionally, there is no tap loss within this embodiment.

In addition, the detected power may also be used to detect failure within the path on which the tunable-gain VLSOA 900 functions. For example, if the input power is approximately zero, this could mean that a signal is not reaching the tunable-gain VLSOA 900. This information can then be communicated to switching and maintenance components in the network. For example, the information can be embedded in the overhead portion of a signal. As a result of this information, a network management system would be able to isolate failures within a maintenance region, often isolating the current problem to a single site. In another example, if the amplifier gain is approximately zero and the input power is normal, this may indicate an amplifier problem. The network can be notified and adjusted accordingly.

By isolating the failure, the network may then rebalance the load on each of the paths within the network. Additionally, this accurate identification of network failure allows for a quick repair of the problem. For example, once a failed path or node has been detected, data may be routed around the path or node and a network manager is notified so that the problem can be quickly repaired.

Figure 10:
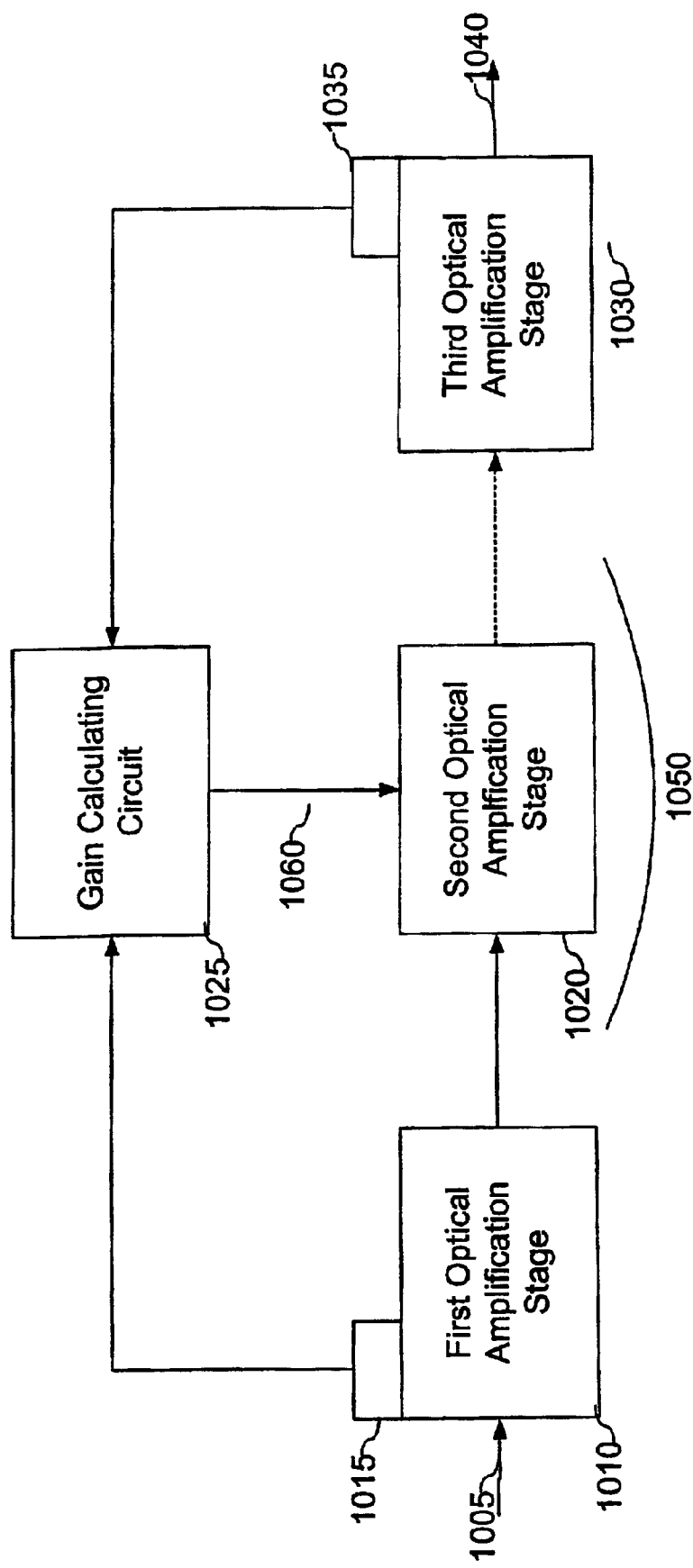
FIG. 10 is a power monitor and gain control circuit using multiple VLSOAs including at least one tuna VLSOA.

FIG. 10 shows a system for monitoring power and controlling the gain on a variable-gain multi-stage optical amplifier. One embodiment of a variable-gain multi-stage optical amplifier includes three stages, two VLSOA stages 1010 and 1030 and a tunable-gain VLSOA stage 1050. Each amplifier stage 1010, 1030, 1050 has an input and an output. The amplifier stages 1010, 1030, and 1050 are coupled in series, with the output of each amplifier stage coupled to the input of the next amplifier stage. The amplifier stages 1010, 1030, 1050 include an amplifying path coupled between the input 1005 and the output 1040 of the variable-gain multi-stage optical amplifier.

As shown in FIG. 10, an input optical signal 1005 enters into a first VLSOA stage 1010. This stage 1010 may comprise a tunable-gain VLSOA or a non-tunable VLSOA. A first detector 1015 is positioned above an emitting surface of the first VLSOA 1010 near the input 1005. This first detector 1015 detects the power of the laser light that is transmitted through the emitting surface of the VLSOA 1010. This information is electrically transmitted to a gain calculating circuit 1025. From this information, the input signal's 1005 power can be determined because of the relation between the emitted laser light and the signal power.

The optical signal propagates through at least one tunable-gain VLSOA 1020 comprising the second optical amplification stage 1050. This stage may be limited to a single VLSOA 1020 or contain multiple VLSOAs coupled together in series. After being amplified, the signal is output through a second VLSOA stage 1030. This stage 1050 may comprise a tunable-gain VLSOA or a non-tunable VLSOA. A second detector 1035 is positioned above an emitting surface of the second VLSOA 1030 near the output. This second detector 1035 detects the power of the laser light emitted through the surface of the second VLSOA 1030. This information is electrically transferred to the gain calculating circuit 1025. From this information, the outputted signal's 1040 power can be determined because of the relation between the emitted laser light and the signal power.

The gain control circuit 1025 calculates the gain across the variable-gain multi-stage optical amplifier. The gain control circuit 1025 may use multiple methods to calculate this gain. For example, the input power 1005 and output power 1040 can be determined from the measurements made by detectors 1015 and 1035, respectively. The gain would then be equal to the output power divided by the input power. Additionally, the gain control circuit 1025 could also make calculations based on the difference between the strength of the emitted laser light detected by detector 1015 and the strength of the emitted laser light detected by detector 1035. Once the gain across the variable gain optical amplifier has been calculated, the gain control circuit controls one or more of the VLSOAs 1020 within the tunable-gain VLSOA stage 1050. This control allows the gain control circuit 1025 to adjust the gain of each VLSOA 1020 via line 1060.

This variable-gain multi-stage optical amplifier allows a power monitor and gain control circuit to dynamically monitor and adjust the strength of a signal as it propagates within a network. As a result, a network may automatically compensate for unforeseen failures or problems within the network. Additionally, a network becomes much easier to build-out and scale.

F. Clock Recovery Using Power Monitor on VLSOA

Figure 11:
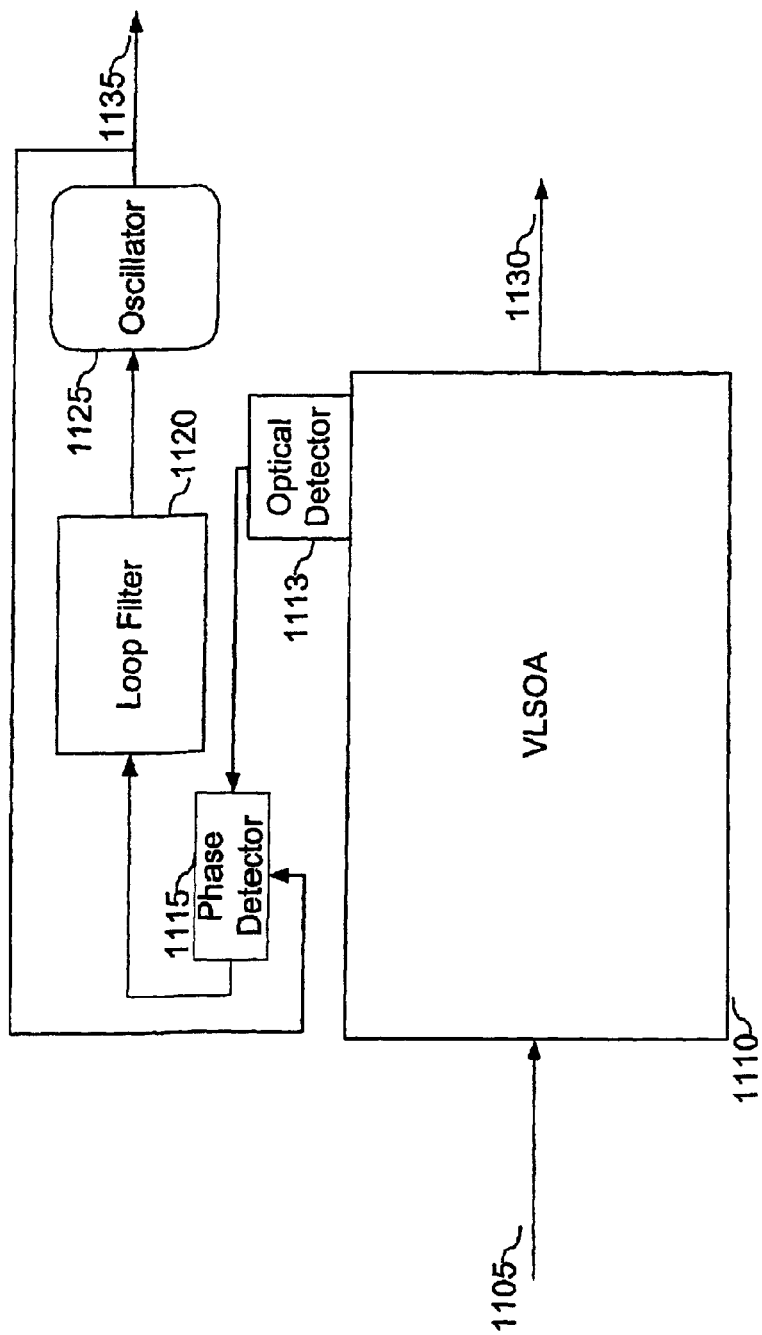
FIG. 11 is a block diagram of a clock recovery system using a VLSOA.

FIG. 11 shows a system for clock recovery implementing laser light detectors on a VLSOA 1100. Often, due to noise generated by components within a network, the actual timing of data will fluctuate or jitter as it travels within fiber. The clock signal that controls the timing of the data often must be re-synchronized with the data, even in the presence of high levels of jitter. Jitter may be caused by a number of different devices within a network. For example, noise generated by an optical amplifier may cause the data to lose its synchronicity with the clock signal. However, this problem can be overcome by deriving the clock signal from the data itself. However, in order to accomplish this recovery, a sample of the signal typically is detected in order to retrieve the clock signal.

The most common type of clock recovery is a phased locked loop circuit. This circuit generally employs a phase detector 1115 that is coupled to a loop filter 1120. An optical detector 1113 is used to detect the ballast laser light emitted from the VLSOA 1110. A phase detector 1115 is coupled to the output of an oscillator 1125. Typically, a phase detector has two inputs: a reference input and a signal input. The phase detector 1115 compares the phases of the detected signal at the optical detector 1113 and the oscillator 1125. From this comparison, an error voltage is produced which is transmitted through a lowpass filter 1120 that removes the higher harmonics in the signal. The oscillator 1125 then responds to the error is voltage and produces an output frequency that matches the frequency of the laser light at the optical detector 1113. However, since fluctuations in the laser light generated by the VLSOA 1110 reflect fluctuations in the signal 1105, the clock recovered from the laser light will be derived from (and in some cases will be identical to, or an inverse of) the clock in signal 1105.

This recovered clock signal (or one derived from it) can then be used for sampling and regenerating the incoming data.

There are various ways to perform clock recovery that may be implemented on the VLSOA. For example, another common clock recovery technique is the use of a SAW filter for narrow band filtering. As a result, the examples given are not meant to be exclusive implementations of clock recovery in use with a VLSOA.

While the present invention has been described with reference to certain embodiments, those skilled in the art will recognize that various modifications may be provided. For example, various other types of lasing semiconductor optical amplifiers may be used in replace of a VLSOA within the above-described embodiments. These lasing semiconductor optical amplifiers include longitudinal lasing semiconductor optical amplifiers and transverse lasing semiconductor optical amplifiers. Furthermore, it is important to note that all of the above monitoring techniques and sub-systems may be monolithically integrated onto a single substrate. Variations upon and modifications to the embodiments are provided for by the present invention, which is limited only by the following claims.

We claim:

1. A lasing semiconductor optical amplifier (SOA) apparatus comprising:
   a lasing SOA for amplifying an optical signal traveling through the lasing SOA and further for outputting a ballast laser signal which acts as a ballast with respect to amplification of the optical signal; and
   a monitor circuit coupled to receive the ballast laser signal for monitoring the optical signal.

2. The lasing SOA apparatus of claim 1 wherein the lasing SOA comprises:
   an input for receiving the optical signal;
   a laser cavity coupled to the input, the laser cavity adapted to amplify the optical signal and output the ballast laser signal; and
   an output coupled to the laser cavity, the output adapted to transmit the optical signal from the lasing SOA.

3. The lasing SOA apparatus of claim 2 wherein the laser cavity comprises:
   a top mirror;
   a bottom mirror;
   an active region positioned between the top mirror and the bottom mirror, and
   a pump coupled to the active region, the pump adapted to increase a carrier density population within the active region.

4. The lasing SOA apparatus of claim 2 wherein the laser cavity is oriented vertically with respect to an amplification path of the optical signal.

5. The lasing SOA apparatus of claim 2 wherein the laser cavity is oriented horizontally with respect to an amplification path of the optical signal.

6. The lasing SOA apparatus of claim 2 wherein the laser cavity is oriented transversely with respect to an amplification path of the optical signal.

7. The lasing SOA apparatus of claim 1 wherein the monitor circuit comprises at least one detector positioned to convert the ballast laser signal to an electrical signal.

8. The lasing SOA apparatus of claim 7 wherein the at least one detector is positioned near an input on the lasing SOA.

9. The lasing SOA apparatus of claim 7 wherein the at least one detector is positioned near an output on the lasing SOA.

10. The lasing SOA apparatus of claim 7 wherein the monitor circuit further comprising:
a first detector positioned near an input of the lasing SOA, the first detector adapted to convert the ballast laser signal to a first electrical signal corresponding to an optical signal at the input of the lasing SOA; and
a second detector positioned near an output of the lasing SOA, the second detector adapted to convert the ballast laser signal to a second electrical signal corresponding to an optical signal at the output of the lasing SOA.

11. The lasing SOA apparatus of claim 7 wherein the at least one detector is integrated within a lasing SOA chip.

12. The lasing SOA apparatus of claim 7 wherein the at least one detector is hard-wired above the lasing SOA.

13. The lasing SOA apparatus of claim 7 wherein the monitor circuit further comprises a gain calculating circuit coupled to the at least one detector, the gain calculating circuit adapted to determine a gain across the lasing SOA.

14. The lasing SOA apparatus of claim 13 wherein the monitor circuit is coupled to a terminal that displays the gain across the lasing SOA.

15. The lasing SOA apparatus of claim 13 wherein a warning signal is generated if the gain across the lasing SOA crosses a threshold value.

16. A tunable-gain lasing SOA apparatus comprising:
a tunable-gain lasing SOA for amplifying an optical signal traveling through the tunable-gain lasing SOA and further for outputting a ballast laser signal which acts as a ballast with respect to amplification of the optical signal;
a monitor circuit coupled to receive the ballast laser signal for monitoring the optical signal; and
a gain control circuit coupled to adjust across the tunable-gain lasing SOA.

17. The tunable-gain lasing SOA apparatus of claim 16 wherein the tunable-gain lasing SOA comprises:
an input for receiving the optical signal;
a tunable laser cavity coupled to the input, the tunable laser cavity adapted to amplify the optical signal and output the ballast laser signal; and
an output coupled to the tunable laser cavity, the output adapted to transmit the optical signal from the lasing SOA.

18. The tunable-gain lasing SOA apparatus of claim 17 wherein the tunable laser cavity comprises:
a top mirror;
a bottom mirror;
an active region positioned between the top mirror and the bottom mirror;
a pump coupled to the active region, the pump adapted to increase a carrier density population within the active region; and
a tunable region for adjusting a loss within the tunable laser cavity.

19. The tunable-gain lasing SOA apparatus of claim 18 wherein the tunable region comprises a liquid crystal layer.

20. The tunable-gain lasing SOA apparatus of claim 18 wherein the tunable region is positioned between the active region and the top mirror.

21. The tunable-gain lasing SOA apparatus of claim 18 wherein the tunable region is positioned between the active region and the bottom mirror.

22. The tunable-gain lasing SOA apparatus of claim 18 wherein the tunable laser cavity further comprises a tuning mirror.

23. The tunable-gain lasing SOA apparatus of claim 22 wherein the tunable region is positioned above the top mirror and below the tuning mirror.

24. The tunable-gain lasing SOA apparatus of claim 22 wherein the tunable region is positioned below the bottom mirror and above the tuning mirror.

25. The tunable-gain lasing SOA apparatus of claim 17 wherein the tunable laser cavity is oriented vertically with respect to an amplification path of the optical signal.

26. The tunable-gain lasing SOA apparatus of claim 17 wherein the tunable laser cavity is oriented horizontally with respect to an amplification path of the optical signal.

27. The tunable-gain lasing SOA apparatus of claim 17 wherein the tunable laser cavity is oriented transversely with respect to an amplification path of the optical signal.

28. The tunable-gain lasing SOA apparatus of claim 16 wherein the monitor circuit comprises at least one detector positioned to covert the ballast laser signal to an electrical signal.

29. The tunable-gain lasing SOA apparatus of claim 28 wherein the at least one detector is positioned near an input on the tunable-gain lasing SOA.

30. The tunable-gain lasing SOA apparatus of claim 28 wherein the at least one detector is positioned near an output on the tunable-gain lasing SOA.

31. The tunable-gain lasing SOA apparatus of claim 28 further comprising:
a first detector positioned near an input of the tunable-gain lasing SOA, the first detector adapted to convert the ballast laser signal to a first electrical signal corresponding to an optical signal at the input of the tunable-gain lasing SOA; and
a second detector positioned near an output of the tunable-gain lasing SOA, the second detector adapted to convert the ballast laser signal to a second electrical signal corresponding to an optical signal at the output of the tunable-gain lasing SOA.

32. The tunable-gain lasing SOA apparatus of claim 28 wherein the at least one detector is integrated within a tunable-gain lasing SOA chip.

33. The tunable-gain lasing SOA apparatus of claim 28 wherein the monitor circuit further comprises a gain calculating circuit coupled to the at least one detector, the gain calculating circuit adapted to determine a gain across the tunable-gain lasing SOA.

34. The tunable-gain lasing SOA apparatus of claim 33 wherein the monitor circuit is coupled to a terminal that displays the gain across the lasing SOA.

35. The tunable-gain lasing SOA apparatus of claim 33 wherein a warning signal is generated if the gain across the lasing SOA crosses a threshold value.

36. The tunable-gain lasing SOA apparatus of claim 17 wherein the gain control circuit is coupled to the tunable laser cavity and the gain calculating circuit, the gain control circuit adapted to adjust a loss coefficient corresponding to the tunable laser cavity.

37. The tunable-gain lasing SOA apparatus of claim 36 wherein the gain control circuit adjusts the loss coefficient by controlling a tunable region within the tunable laser cavity.

38. A multi-stage optical amplifier comprising:
a first optical amplifier stage having an input for receiving an optical signal, the first optical amplifier stage comprising a first lasing SOA;
a second optical amplifier stage coupled to the first optical amplifier stage, the second optical amplifier stage comprising a second lasing SOA;
a third optical amplifier stage coupled to the second optical amplifier stage, the third optical amplifier stage comprising a third lasing SOA and adapted to transmit the optical signal from the multi-stage optical amplifier; and
a monitor circuit coupled to at least one optical amplifier stage for monitoring the power of the optical signal.

39. The multi-stage optical amplifier of claim 38 wherein at least one of the lasing SOAs comprises:
an input for receiving the optical signal;
a laser cavity coupled to the input, the laser cavity adapted to amplify the optical signal and output a ballast laser signal; and
an output coupled to the laser cavity, the output adapted to transmit the optical signal from the lasing SOA.

40. The multi-stage optical amplifier of claim 39 wherein the monitor circuit comprises at least one detector positioned to convert at least one ballast laser signal to an electrical signal.

41. The multi-stage optical amplifier of claim 40 wherein a detector is positioned on the first lasing SOA to convert the ballast laser signal to an electrical signal corresponding to the optical signal in the first optical amplifier stage.

42. The multi-stage optical amplifier of claim 40 wherein a detector is positioned on the third lasing SOA to convert the ballast laser signal to an electrical signal corresponding to the optical signal in the third optical amplifier stage.

43. The multi-stage optical amplifier of claim 39 wherein the monitor circuit further comprising:
a first detector positioned on the first lasing SOA to convert the ballast laser signal to an electrical signal corresponding to the optical signal in the first optical amplifier stage;
a second detector positioned on the third lasing SOA to convert the ballast laser signal to an electrical signal corresponding to the optical signal in the third optical amplifier stage;
a gain control circuit coupled to the first detector, the second detectors, and the second optical amplifier stage, the gain control circuit adapted to control the gain across the second optical amplifier stage.

44. The multi-stage optical amplifier of claim 38 wherein the second optical amplifier includes a tunable-gain lasing SOA comprising:
an input for receiving the optical signal;
a tunable laser cavity coupled to the input, the tunable laser cavity adapted to amplify the optical signal and output the ballast laser signal; and
an output to the tunable laser cavity, the output adapted to transmit the optical signal from the lasing SOA.

45. The tunable-gain SOA apparatus of claim 44 wherein the monitor circuit comprises:
a first detector on the first lasing SOA to convert the ballast laser signal to an electrical signal corresponding to the optical signal in the first optical amplifier stage;
a second detector positioned on the third lasing SOA to convert the ballast laser signal to an electrical signal corresponding to the optical signal in the third optical amplifier stage;
a gain control circuit coupled to the first detector, the second detectors, and the second optical amplifier stage, the gain control circuit adapted to adjust the gain across the second optical amplifier stage by controlling the loss within the tunable laser cavity.

46. A method for monitoring an optical signal, the method comprising:
amplifying an optical signal as the optical signal travels through a lasing semiconductor optical amplifier (SOA);
outputting a ballast laser signal from the lasing SOA, wherein the ballast laser signal acts as a ballast with respect to amplification of the optical signal;
detecting the ballast laser signal; and
monitoring the optical signal in response to the detected ballast laser signal.

47. The method of claim 46 wherein at least one detector converts the ballast laser signal to an electrical signal corresponding to the optical signal.

48. The method of claim 47 wherein a detector converts the ballast laser signal near an input on the lasing SOA to an electrical signal that corresponds to the optical signal near the input of the lasing SOA.

49. The method of claim 47 wherein a detector converts the ballast laser signal near an output of the lasing SOA to an electrical signal that corresponds to the optical signal near the output of the lasing SOA.

50. The method of claim 47 further comprising the steps of:
converting the ballast laser signal to at least one electrical signal; and
calculating a gain across the lasing SOA using the at least one electrical signal.

51. A method for controlling the power of an optical signal, the method comprising:
amplifying an optical signal as the optical signal travels through a tunable-gain lasing SOA;
outputting a ballast laser signal from the tunable-gain lasing SOA, wherein the ballast laser signal acts as a ballast with respect to amplification of the optical signal;
detecting the ballast laser signal;
monitoring the optical signal in response to the detected ballast laser signal; and
adjusting the gain of the tunable-gain lasing SOA in response to the detected ballast laser signal.

52. The method of claim 51 wherein the gain of the tunable-gain lasing SOA is adjusted by adjusting a loss of a tunable laser cavity within the tunable-gain lasing SOA.

53. The method of claim 51 wherein at least one detector converts the ballast laser signal to an electrical signal corresponding to the optical signal.

54. The method of claim 51 wherein a detector converts the ballast laser signal near an input on the tunable-gain lasing SOA to an electrical signal that corresponds to the optical signal near the input of the tunable-gain lasing SOA.

55. The method of claim 51 wherein a detector converts the ballast laser signal near an output of the tunable-gain lasing SOA to an electrical signal that corresponds to the optical signal near the output of the tunable-gain lasing SOA.

56. The method of claim 51 further comprising the steps of:

converting the ballast laser signal to at least one electrical signal;

calculating a gain across the tunable-gain lasing SOA using the at least one electrical signal; and adjusting the gain across the tunable-gain lasing SOA in response to the calculated gain.

57. A method for controlling a multi-stage lasing SOA, the method comprising:

amplifying an optical signal as the optical signal travels through a first optical amplifying stage;

outputting a first ballast laser signal from the first optical amplification stage wherein the first ballast laser signal acts as a ballast with respect to amplification of the optical signal;

amplifying the optical signal as the optical signal travels through a second optical amplification stage;

outputting a second ballast laser signal from the second optical amplification stage wherein the second ballast laser signal acts as a ballast with respect to amplification of the optical signal;

amplifying the optical signal as the optical signal travels through a third optical amplification stage;

outputting a third ballast laser signal from the third optical amplification stage wherein the third ballast laser signal acts as a ballast with respect to amplification of the optical signal;

detecting at least one of the ballast laser signals; and monitoring the optical signal in response to the at least one detected ballast laser signal.

58. The method of claim 57 wherein each of the optical amplification stages comprise at least one lasing SOA.

59. The method of claim 57 wherein the second optical amplification stage comprises a tunable-gain lasing SOA.

60. The method of claim 59 wherein the gain across the second optical amplification stage is adjusted in response to the at least one detected ballast laser signals.

61. The method of claim 60 wherein the gain across the second optical amplification stage is adjusted by adjusting a tunable region in the tunable-gain lasing SOA.

62. A lasing SOA apparatus comprising:

a lasing SOA for amplifying an optical signal traveling through the lasing SOA and further for outputting a ballast laser signal which acts as a ballast with respect to amplification of the optical signal; and a detector positioned so that the ballast laser signal may be converted to an electrical signal for monitoring the optical signal.

63. The lasing SOA apparatus of claim 62 wherein the lasing SOA is a vertical lasing SOA.

64. The lasing SOA apparatus of claim 62 wherein the lasing SOA is a horizontal lasing SOA.

65. The lasing SOA apparatus of claim 62 wherein the lasing SOA is a longitudinal lasing SOA.

* * * * *

UNITED STATES PATENT AND TRADEMARK OFFICE
CERTIFICATE OF CORRECTION

PATENT NO.        : 6,822,787 B1
APPLICATION NO.   : 10/061585
DATED             : November 23, 2004
INVENTOR(S)       : DiJaili et al.

It is certified that error appears in the above-identified patent and that said Letters Patent is hereby corrected as shown below:

Title Page,
Page 2, under "OTHER PUBLICATIONS", column 2, line 32, after "MQW Laser Amplifiers,"" change "IEE" to --IEEE--

Column 2,
Line 54, after "may drastically" change "effect" to --affect--

Column 3,
Line 45, change "by tuning" to --by turning--
Line 62, after "are not necessarily" change "done" to --drawn--

Column 4,
Line 27, after "at least one" change "tuna" to --tunable gain--
Line 59, change "signal is input" to --signal, input--

Column 5,
Lines 1-2, after "range of wavelengths" remove [that they can amplify]

Column 7,
Line 22, after "dashed region" change "521." to --530.--
Line 60, after "for example" change "InGaAs" to --InAlGaAs--

Column 8,
Line 21, after "for simplicity," change "in FIG. 5," to --in FIG. 5B,--

Column 9,
Line 67, before "(specifically, alternating" remove [is]

Column 10,
Line 11, before "$1+(n_1/n_2)^{2N}|\}^2$," insert --|--
Line 19, change "Commnonly" to --Commonly--

Column 11,
Line 35, before "VLSOA 600" remove [VLSOA]

Column 12,
Line 2, change "into overhead of" to --into the overhead of a--

Column 16,
Line 42, before "created damage-related" insert --to--

CERTIFICATE OF CORRECTION (continued)
U.S. Pat. No. 6,822,787 B1

Column 17,
Line 20, after "laser light" change "outputted" to --output--
Line 23, before "through the surface 970" change "outputted" to --output--
Line 50, before "a VLSOA chip" insert --on--

Column 19,
Line 4, before "VLSOA stage 1030." change "second" to --third--
Line 7, before "VLSOA stage 1030." change "second" to --third--
Line 9, before "VLSOA stage 1030." change "second" to --third--
Line 66, before "voltage and produces" remove [is]

Column 20,
Line 19, before "of a VLSOA" change "replace" to --place--

Column 21,
Line 8, change "comprising:" to --comprises:--

Column 22,
Line 24, before "the ballast laser signal" change "covert" to --convert--

Column 23,
Line 37, change "comprising:" to --comprises:--

Signed and Sealed this

Ninth Day of February, 2010

David J. Kappos
*Director of the United States Patent and Trademark Office*